US010121429B2

(12) United States Patent
Tanaka et al.

(10) Patent No.: US 10,121,429 B2
(45) Date of Patent: Nov. 6, 2018

(54) ACTIVE MATRIX SUBSTRATE, DISPLAY PANEL, AND DISPLAY DEVICE INCLUDING THE SAME

(71) Applicant: Sharp Kabushiki Kaisha, Osaka-shi, Osaka (JP)

(72) Inventors: Kohhei Tanaka, Osaka (JP); Hidefumi Yoshida, Osaka (JP)

(73) Assignee: Sharp Kabushiki Kaisha, Sakai (JP)

( * ) Notice: Subject to any disclaimer, the term of this patent is extended or adjusted under 35 U.S.C. 154(b) by 44 days.

(21) Appl. No.: 14/916,224

(22) PCT Filed: Aug. 27, 2014

(86) PCT No.: PCT/JP2014/072453
§ 371 (c)(1),
(2) Date: Mar. 3, 2016

(87) PCT Pub. No.: WO2015/033838
PCT Pub. Date: Mar. 12, 2015

(65) Prior Publication Data

US 2016/0217757 A1 Jul. 28, 2016

(30) Foreign Application Priority Data

Sep. 4, 2013 (JP) ................................ 2013-183395

(51) Int. Cl.
*G09G 3/36* (2006.01)
*G11C 19/28* (2006.01)
(Continued)

(52) U.S. Cl.
CPC ......... *G09G 3/3648* (2013.01); *G02F 1/1362* (2013.01); *G02F 1/13306* (2013.01);
(Continued)

(58) Field of Classification Search
None
See application file for complete search history.

(56) References Cited

U.S. PATENT DOCUMENTS

2005/0248558 A1 11/2005 Kobashi
2006/0210012 A1* 9/2006 Yamaguchi ............ G11C 19/28 377/64
(Continued)

FOREIGN PATENT DOCUMENTS

JP 06-95073 A 4/1994
JP 10-197851 A 7/1998
(Continued)

OTHER PUBLICATIONS

Official Communication issued in International Patent Application No. PCT/JP2014/072453, dated Nov. 25, 2014.

*Primary Examiner* — Matthew Yeung
(74) *Attorney, Agent, or Firm* — Keating & Bennett, LLP

(57) ABSTRACT

The present invention addresses the problem of reducing power consumption when switching a gate line between a selected state and a non-selected state, and of providing a narrower frame for an active matrix substrate. A gate driver (11) that scans each gate line is formed inside a display area in an active matrix substrate (20*a*) having gate lines (13G) and data lines formed therein. The gate driver (11) switches the gate line to either a selected state or a non-selected state, in accordance with a control signal supplied via a line (15L). The gate driver (11) includes a high-charge drive circuit (11*a*), a low-charge drive circuit (11*b*), and a shift register (11*c*). The high-charge drive circuit is supplied with a first DC voltage signal corresponding to the selected state via the line (15L), and charges the gate line to the potential of the first DC voltage signal. The low-charge drive circuit (11*b*) is supplied with a second DC voltage signal corresponding to the non-selected state, and charges the gate line to the potential of the second DC voltage signal.

3 Claims, 29 Drawing Sheets

(51) Int. Cl.
*G02F 1/133* (2006.01)
*G02F 1/1335* (2006.01)
*G02F 1/1362* (2006.01)
*G02F 1/1345* (2006.01)

(52) U.S. Cl.
CPC .... *G02F 1/13454* (2013.01); *G02F 1/133514* (2013.01); *G09G 3/3677* (2013.01); *G11C 19/28* (2013.01); *G09G 2300/0426* (2013.01); *G09G 2300/0804* (2013.01); *G09G 2310/0248* (2013.01); *G09G 2310/0286* (2013.01); *G09G 2310/0289* (2013.01); *G09G 2310/08* (2013.01); *G09G 2330/021* (2013.01); *G09G 2340/0442* (2013.01)

(56) References Cited

U.S. PATENT DOCUMENTS

| | | | |
|---|---|---|---|
| 2008/0088568 A1* | 4/2008 | Haga | G09G 3/18 345/100 |
| 2008/0136805 A1* | 6/2008 | Kawagoshi | G09G 3/3696 345/211 |
| 2012/0076256 A1 | 3/2012 | Yonemaru et al. | |
| 2012/0154457 A1* | 6/2012 | Katsumoto | G09G 3/3648 345/690 |
| 2012/0194489 A1 | 8/2012 | Iwamoto et al. | |
| 2012/0200544 A1 | 8/2012 | Iwamoto et al. | |
| 2012/0206434 A1* | 8/2012 | Tsai | G09G 3/3677 345/212 |
| 2013/0021066 A1* | 1/2013 | Chen | G09G 3/3688 327/108 |
| 2013/0321499 A1* | 12/2013 | Park | G09G 3/3611 345/698 |

FOREIGN PATENT DOCUMENTS

| | | |
|---|---|---|
| JP | 11-184406 A | 7/1999 |
| JP | 2005-321457 A | 11/2005 |
| WO | 2010/146738 A1 | 12/2010 |
| WO | 2011/055569 A1 | 5/2011 |
| WO | 2011/055570 A1 | 5/2011 |
| WO | 2013/018598 A1 | 2/2013 |

* cited by examiner

ACTIVE MATRIX SUBSTRATE, DISPLAY PANEL, AND DISPLAY DEVICE INCLUDING THE SAME

TECHNICAL FIELD

The present invention relates to an active matrix substrate, a display panel, and a display device including the same, and in particular relates to a gate driver.

BACKGROUND ART

International Publication No. WO2010/146738 discloses a shift register for scanning gate bus lines. This shift register is composed of a plurality of cascade-connected stages the number of which corresponds to the number of the gate bus lines. Each stage has terminals to which a high-level power source voltage and a low-level power source voltage are input, respectively, and terminals to which an output signal sent from the previous stage and an output signal sent from the next stage are input, respectively. Further, each stage has a terminal to which a clock signal is input, and a terminal through which an output signal of the current stage itself is output as a gate pulse. Each stage is composed of a plurality of transistors including a transistor (M5) and a transistor (M6), and a capacitor that are connected to one another. The transistor (M5) is connected to the terminal to which the high-level power source voltage is input. Further, the transistor (M6) is connected to a terminal into which the low-level power source voltage is input.

An internal node in a shift register in each stage has a potential that changes with a clock signal. According to a change of the potential of the internal node, the transistor (M5) is turned on, and a power source voltage VDD is output as a gate pulse via the transistor (M5). This shifts a gate bus line into a selected state. Further, the transistor (M6) is turned ON in response to the clock signal, and the transistor (M6) causes the potential of the internal node to have a power source voltage VSS, thereby decreasing the gate pulse. This shifts the gate bus into a non-selected state.

DISCLOSURE OF INVENTION

The shift register disclosed in Patent Document 1 mentioned above causes the gate lines to be charged to the high level and the low level by using the power source voltages VDD and VSS supplied to the transistors (M5) and (M6). As compared with the case where the supply of the clock signal causes the gate lines to be charged to the high level or the low level, the load onto the clock lines is reduced, whereby the electric power consumption is reduced. The circuit that charges the gate lines to the high level and the circuit that charges the gate lines to the low level, however, are required to have a high driving power in order to charge the gate lines, thereby having larger circuit sizes. In a case where such a circuit is arranged outside a display area, the frame region outside the display area is enlarged, which impairs the design properties of the display.

It is an object of the present invention to reduce electric power consumption upon the switching of the gate line between the selected state and the non-selected state, and to provide techniques for providing a narrower frame of the active matrix substrate.

An active matrix substrate according to the first invention includes a plurality of gate lines, and a plurality of data lines that intersect the gate lines, the active matrix substrate having a display area, and the active matrix substrate further includes: drive circuits provided for the gate lines, respectively, each drive circuit switching a state of the gate line according to a control signal supplied thereto, to either one of a selected state for selection of the gate line and a non-selection state for non-selection of the gate line, wherein each drive circuit includes a first charging driving part and a second charging driving part, wherein the first charging driving part includes a switching element that is supplied with a first DC voltage signal corresponding to the selected state, the switching element charging the gate line to a potential of the first DC voltage signal, the second charging driving part includes a switching element that is supplied with a second DC voltage signal corresponding to the non-selected state and having a voltage lower than that of the first DC voltage signal, the switching element charging the gate line to a potential of the second DC voltage signal, and at least one of the first charging driving part and the second charging driving part is formed in the display area.

The second invention, in addition to the first invention, further has the following characteristics. The gate lines are N in number (N is an integer); the first charging driving part in the n'th drive circuit provided with respect to the n'th gate line ($2 \leq n \leq N-1$), among the drive circuits, is connected to the n−1'th gate line, and charges the n'th gate line to the potential of the first DC voltage signal according to the potential of the n−1'th gate line; and the switching element of the second charging driving part in the n'th drive circuit is connected to the drive circuit provided with respect to the n+1'th gate line, and charges the n'th gate line to a potential of the second DC voltage signal, according to the output potential from the drive circuit.

The third invention, in addition to the first or second invention, further has the following characteristics. The gate lines are N in number (N is an integer); the control signal includes M clock signals (M is an integer satisfying $N > M \geq 2$), each clock signal having an amplitude that changes every period that is longer than one horizontal scanning period; the M clock signals have a phase difference equal to the one horizontal scanning period; the M clock signals are supplied to the drive circuits in such a manner that each of the M clock signals are supplied to every M/2 lines that are different from one clock signal to another; the first charging driving part of the drive circuit charges the gate line to a potential of the first DC voltage signal for a period longer than one horizontal scanning period; and the charging periods for charging adjacent ones of the gate lines by the first charging driving part overlap for at least one horizontal scanning period.

The fourth invention, in addition to the first invention, further has the following characteristics. The gate lines are N in number (N is an integer); the first charging driving part in the n'th drive circuit provided with respect to the n'th gate line ($2 \leq n \leq N$), among the drive circuits, is connected to the n−1'th gate line, and charges the n'th gate line to the potential of the first DC voltage signal according to a potential of the n−1'th gate line; and the second charging driving part in the n'th drive circuit charges the n'th gate line to the potential of the second DC voltage signal according to the potential of the n'th gate line.

The fifth invention, in addition to the first invention, further has the following characteristics. The gate lines are N in number (N is an integer); a first start pulse signal is input to the first charging driving part in the first drive circuit provided with respect to the first gate line, among the drive circuits, and the first charging driving part charges the first gate line to the potential of the first DC voltage signal according to the first start pulse signal; a second start pulse signal different from the first start pulse signal is input to the second charging driving part in the first drive circuit, and the second charging driving part charges the first gate line to the potential of the second DC voltage signal according to the second start pulse signal; the first charging driving part in the n'th drive circuit provided with respect to the n'th gate line (2≤n≤N), among the drive circuits, is connected to the n−1'th gate line, and the first charging driving part charges the n'th gate line to the potential of the first DC voltage signal according to the potential of the n−1'th gate line; and the second charging driving part in the n'th drive circuit is connected to the second charging driving part in the drive circuit provided with respect to the n−1'th gate line, and charges the n'th gate line to the potential of the second DC voltage signal according to the output potential of the second charging driving part in the n−1'th drive circuit.

A display panel according to the sixth invention includes: the active matrix substrate according to any one of the first to fifth inventions; a pixel electrode formed on the active matrix substrate; a counter substrate including a common electrode and a color filter; and a liquid crystal layer interposed between the active matrix substrate and the counter substrate.

A display device according to the seventh invention includes: the display panel according to the sixth invention; a display control circuit that outputs a control signal including a clock signal to the display panel; and a power source circuit that supplies a DC voltage signal to the display panel.

With the configuration of the present invention, the electric power consumption when a gate line is switched between a selected state and a non-selected state can be reduced, and at the same time, a narrower frame can be provided in an active matrix substrate.

DESCRIPTION OF PREFERRED EMBODIMENTS

Figure 1:
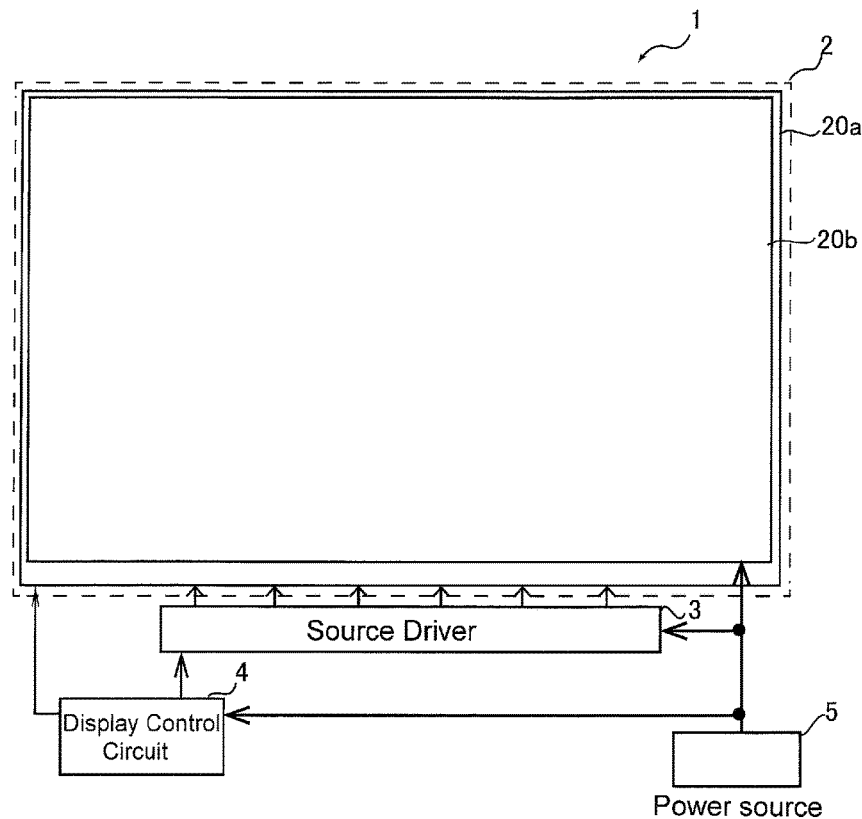
FIG. 1 is a top view that schematically illustrates a schematic configuration of a liquid crystal display device according to Embodiment 1.

An active matrix substrate according to an embodiment of the present invention is an active matrix substrate that includes a plurality of gate lines and a plurality of data lines that intersect the gate lines, and has a display area. The active matrix substrate further includes drive circuits provided for the gate lines, respectively, each drive circuit switching a state of the gate line according to a control signal supplied thereto, to either one of a selected state for selection of the gate line and a non-selection state for non-selection of the gate line, wherein each drive circuit includes a first charging driving part and a second charging driving part, wherein the first charging driving part includes a switching element that is supplied with a first DC voltage signal corresponding to the selected state, the switching element charging the gate line to a potential of the first DC voltage signal, the second charging driving part includes a switching element that is supplied with a second DC voltage signal corresponding to the non-selected state and having a voltage lower than that of the first DC voltage signal, the switching element charging the gate line to a potential of the second DC voltage signal, and at least one of the first charging driving part and the second charging driving part is formed in the display area (the first configuration).

According to the first configuration, the active matrix substrate including the gate lines and the data lines further includes drive circuits that are provided with respect to the gate lines, respectively, and control the state of the gate lines between a selected state and a non-selected state. The drive circuit includes a first charging driving part and a second charging driving. The first charging driving part includes a switching element that is supplied with a first DC voltage signal corresponding to the selected state, and charges the gate line to a potential of the first DC voltage signal. The second charging driving part includes a switching element that is supplied with a second DC voltage signal corresponding to the non-selected state and having a voltage lower than that of the first DC voltage signal, and charges the gate line to a potential of the second DC voltage signal. At least one of the first charging driving part and the second charging driving part is formed in the display area. Each gate line is switched to the selected state or the non-selected state by the charging by the first charging driving part or the second charging driving part. These circuits, which switch the gate line between the selected state and the non-selected state, has a high driving capability, thereby having large circuit sizes. Since at least one of the first charging driving part and the second charging driving part is formed within the display area, the area outside the display area is not as large as that in the case where these circuits are formed outside the display area, whereby a narrower frame can be provided. Further, the first DC voltage signal and the second DC voltage signal are supplied to the first charging driving circuit and the second charging driving circuit, respectively. As compared with the case where the clock signal is supplied to these switching elements and the gate line is charged to the potential of the first DC voltage signal or the second DC voltage signal, therefore, the load capacitance of the line for supplying the clock signal can be reduced, whereby the electric power consumption can be reduced.

The second configuration may be the first configuration further characterized in that the gate lines are N in number (N is an integer), the first charging driving part in the n'th drive circuit provided with respect to the n'th gate line (2≤n≤N−1), among the drive circuits, is connected to the n−1'th gate line, and charges the n'th gate line to the potential of the first DC voltage signal according to the potential of the n−1'th gate line, and the switching element of the second charging driving part in the n'th drive circuit is connected to the drive circuit provided with respect to the n+1'th gate line, and charges the n'th gate line to a potential of the second DC voltage signal, according to the output potential from the drive circuit.

According to the second configuration, the first charging driving part in the n'th drive circuit provided with respect to the n'th gate line charges the n'th gate line to the potential of the first DC voltage signal according to the potential of the n−1'th gate line. The switching element of the second charging driving part in the n'th drive circuit charges the n'th gate line to a potential of the second DC voltage signal, according to the output potential from the drive circuit provided with respect to the n+1'th gate line. Since at least either the first charging driving part or the second charging driving part is formed outside the display area, the size of the area outside the display area display area can be decreased, as compared with both are formed outside the display area. Further, since the first DC voltage signal and the second DC voltage signal are supplied to the switching elements of the first charging driving part and those of the second charging driving part, respectively, the load capacitance of the line for supplying the clock signal can be reduced, and the electric power consumption can be reduced, as compared with the case where the clock signal is supplied to the first charging driving part and the second charging driving part so as to charge the gate line.

The third configuration may be the first or second configuration further characterized in that the gate lines are N in number (N is an integer), the control signal includes M clock signals (M is an integer satisfying N>M≥2), each clock signal having an amplitude that changes every period that is longer than one horizontal scanning period, the M clock signals have a phase difference equal to the one horizontal scanning period, the M clock signals are supplied to the drive circuits in such a manner that each of the M clock signals are supplied to every M/2 lines that are different from one clock signal to another, the first charging driving part of the drive circuit charges the gate line to a potential of the first DC voltage signal for a period longer than one horizontal scanning period, and the charging periods for charging adjacent ones of the gate lines by the first charging driving part overlap for at least one horizontal scanning period.

According to the third configuration, the control signal includes M clock signals each of which has an amplitude that changes every period that is longer than one horizontal scanning period, and the M clock signals have a phase difference equal to the one horizontal scanning period. The M clock signals are supplied to the drive circuits in such a manner that each of the M clock signals is supplied to every M/2 lines that are different from one clock signal to another. The period of charging with respect to each drive circuit by the first charging driving part is longer than one horizontal scanning period, and the charging periods for charging adjacent ones of the gate lines overlap for at least one horizontal scanning period. By charging the drive circuit with respect to each gate line, with a clock signal having an amplitude that changes every period that is longer than one horizontal scanning period, the period of charging by the first charging driving part can be set longer than one horizontal scanning period. Consequently, the operating margin for the drive circuit can be improved. Further, as compared with the case where a clock signal having an amplitude that changes every horizontal scanning period is supplied, the frequency of the clock signal is reduced, whereby the electric power consumption can be reduced.

The fourth configuration may be the first configuration further characterized in that the gate lines are N in number (N is an integer), the first charging driving part in the n'th drive circuit provided with respect to the n'th gate line (2≤n≤N), among the drive circuits, is connected to the n−1'th gate line, and charges the n'th gate line to the potential of the first DC voltage signal according to a potential of the n−1'th gate line, and the second charging driving part in the n'th drive circuit charges the n'th gate line to the potential of the second DC voltage signal according to the potential of the n'th gate line.

According to the fourth configuration, the first charging driving part in the n'th drive circuit provided with respect to the n'th gate line charges the n'th gate line according to a potential of the n−1'th gate line. The second charging driving part in the n'th drive circuit charges the n'th gate line according to the potential of the n'th gate line. In the case of the second configuration, a line has to be drawn from the second charging driving part to the drive circuit so that the output potential of the drive circuit provided with respect to the n+1'th gate line should be input to the second charging driving part. In the present configuration, the second charging driving part of the n'th drive circuit is charged according to the potential of the n'th gate line. Therefore, it is not necessary to draw a line to the drive circuit provided for the adjacent n+1'th line, which causes the parasitic capacitance of the line to be reduced, thereby reducing the electric power consumption, as compared with the second configuration.

The fifth configuration may be the first configuration further characterized in that the gate lines are N in number (N is an integer), a first start pulse signal is input to the first charging driving part in the first drive circuit provided with respect to the first gate line, among the drive circuits, and the first charging driving part charges the first gate line to the potential of the first DC voltage signal according to the first start pulse signal, a second start pulse signal different from the first start pulse signal is input to the second charging driving part in the first drive circuit, and the second charging driving part charges the first gate line to the potential of the second DC voltage signal according to the second start pulse signal, the first charging driving part in the n'th drive circuit provided with respect to the n'th gate line ($2 \leq n \leq N$), among the drive circuits, is connected to the n−1'th gate line, and the first charging driving part charges the n'th gate line to the potential of the first DC voltage signal according to the potential of the n−1'th gate line, and the second charging driving part in the n'th drive circuit is connected to the second charging driving part in the drive circuit provided with respect to the n−1'th gate line, and charges the n'th gate line to the potential of the second DC voltage signal according to the output potential of the second charging driving part in the n−1'th drive circuit.

According to the fifth configuration, a first start pulse signal, and a second start pulse signal that is different from the first start signal are input to the first charging driving part and the second charging driving part in the first drive circuit provided with respect to the first gate line, respectively. The first gate line is charged by the first charging driving part of the first drive circuit to the potential of the first DC voltage signal according to the first start pulse signal. The second gate line is charged by the second charging driving part to the potential of the second DC voltage signal according to the second start pulse signal. The n'th gate line ($2 \leq n \leq N$) is charged by the first charging driving part in the n'th drive circuit provided with respect to the n'th gate line to the potential of the first DC voltage signal according to the potential of the n−1'th gate line. The n'th gate line is charged by the second charging driving part in the n'th drive circuit to the potential of the second DC voltage signal according to the output potential of the second charging driving part in the drive circuit provided with respect to the n−1'th gate line. The first start pulse signal and the second start pulse signal are independently input to the first charging driving part and the second charging driving part of the first drive circuit. This allows the first charging driving part and the second charging driving part to be driven separately, thereby making it possible to arbitrarily set the respective periods for charging the first charging driving part and the second charging driving part of the driving circuit with respect to each gate line, by adjusting timings of the input of the first start pulse signal and the second start pulse signal.

The display panel according to one embodiment of the present invention includes the active matrix substrate according to any one of the first to fifth configurations; a pixel electrode formed on the active matrix substrate; a counter substrate including a common electrode and a color filter; and a liquid crystal layer interposed between the active matrix substrate and the counter substrate (the sixth configuration).

The display device according to one embodiment of the present invention includes the display panel according to the six configuration; a display control circuit that outputs a control signal including a clock signal to the display panel; and a power source circuit that supplies a DC voltage signal to the display panel (the seventh configuration).

Hereinafter, embodiments of the present invention are described in detail with reference to the drawings. Identical or equivalent parts in the drawings are denoted by identical reference numerals, and descriptions of the same are not repeated.

Embodiment 1

(Configuration of Liquid Crystal Display Device)

FIG. 1 is a top view that illustrates a schematic configuration of a liquid crystal display device according to the present embodiment. The liquid crystal display device 1 includes a display panel 2, a source driver 3, a display control circuit 4, and a power source 5. The display panel 2 includes an active matrix substrate 20a, a counter substrate 20b, and a liquid crystal layer (not shown) interposed between these substrates. Though not shown in FIG. 1, polarizing plates are provided on the bottom surface side of the active matrix substrate 20a and on the top surface side of the counter substrate 20b. Further, below the active matrix substrate 20a, a backlight (not shown) is provided. On the counter substrate 20b, there are formed a black matrix, color filters of three colors, which are red (R), green (G), and blue (B), and a common electrode (all not shown).

As illustrated in FIG. 1, the active matrix substrate 20a is electrically connected with the source driver 3. The display control circuit 4 is electrically connected with the display panel 2, the source driver 3, and the power source 5. The power source 5 is electrically connected with the display panel 2, the source driver 3, and the display control circuit 4. In this example, the source driver 3, the display control circuit 4, and the power source 5 are provided on one of long sides of the display panel 2.

The display control circuit 4 outputs control signals to the source driver 3, and a gate driver 11 (see FIG. 3) on the active matrix substrate 20a, which is to be described below. The power source 5 supplies a power source voltage signal to the display panel 2, the source driver 3, and the display control circuit 4.

(Configuration of Active Matrix Substrate)

Figure 2:
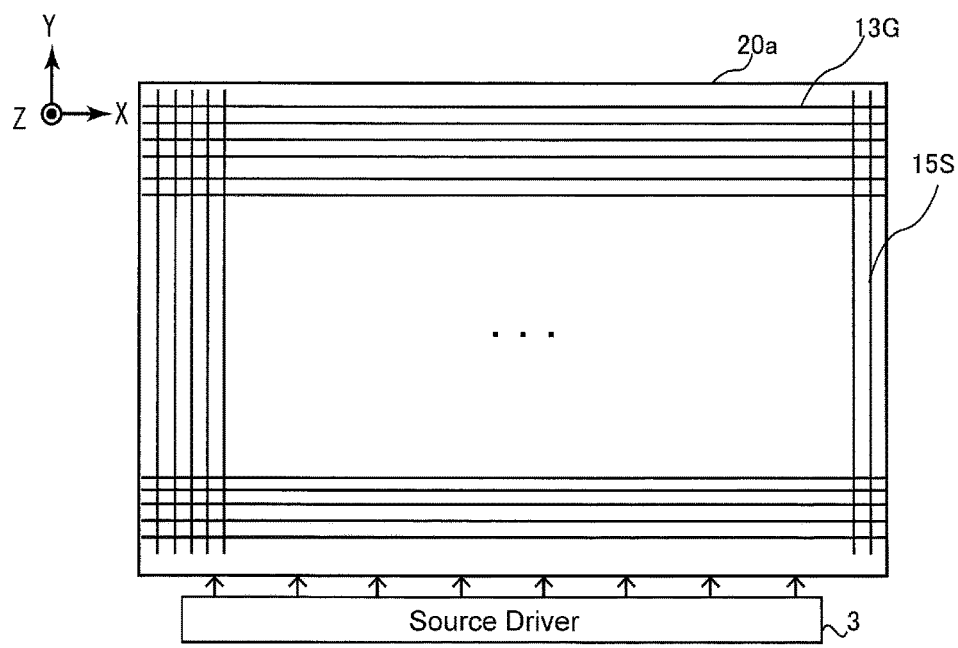
FIG. 2 is a schematic diagram that illustrates a schematic configuration of the active matrix substrate illustrated in FIG. 1.

FIG. 2 is a top view illustrating a schematic configuration of the active matrix substrate 20a. On the active matrix substrate 20a, a plurality of gate lines 13G are formed at a uniform pitch substantially in parallel from one end to the other end of the active matrix substrate 20a in the X-axis direction. Further, on the active matrix substrate 20a, a plurality of source lines (data lines) 15S are formed so as to intersect the gate line 13G group. Each of areas surrounded by the gate lines 13G and the source lines 15S forms one pixel, and corresponds to a certain one color of the color filters. The active matrix substrate 20a includes a display area composed of pixels that are defined by the gate lines 13G and the source lines 15S.

Figure 3:
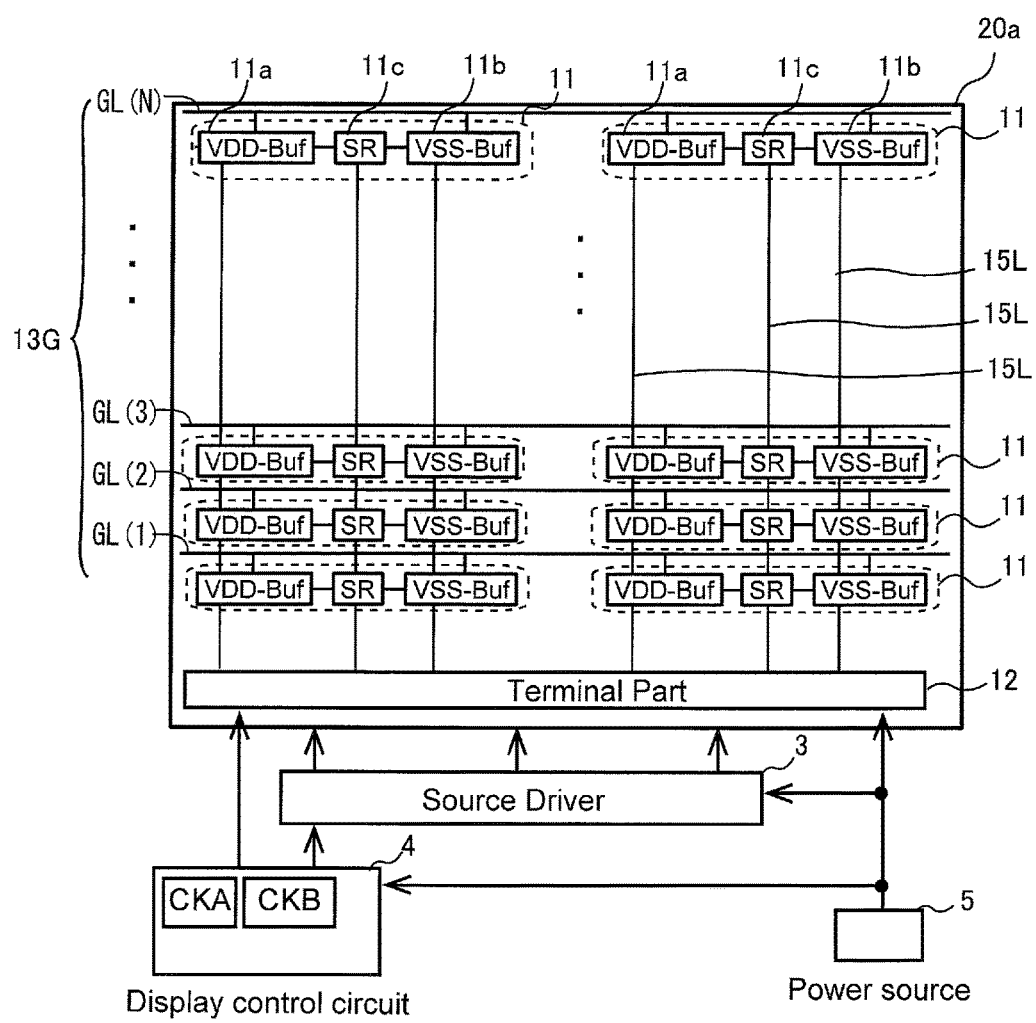
FIG. 3 is a schematic diagram that illustrates a schematic configuration of the active matrix substrate illustrated in FIG. 2.

FIG. 3 is a top view illustrating a schematic configuration of the active matrix substrate 20a, and respective parts connected with the active matrix substrate 20a, with the illustration of the source lines 15S being omitted. As shown in the example illustrated in FIG. 3, in the area between the gate lines GL(1) and GL(N), that is, in the display area, gate drivers (drive circuits) 11 are formed, each of which includes a high-charge drive circuit (VDD-Buf) 11a, a shift register (SR) 11c, and a low-charge drive circuit (VSS-Buf) 11b. The gate driver 11 scans one gate line 13G to which the gate driver 11 is connected.

On the active matrix substrate 20a, lines 15L are formed so as to be approximately parallel to the source lines 15S (see FIG. 2) and be connected to the gate drivers 11. In a region outside the display area, on the side where the source driver 3 is provided (this region is hereinafter referred to as a "frame region"), a terminal part 12 is formed. The terminal part 12 is connected to the display control circuit 4, the power source 5, and the lines 15L.

The display control circuit 4 outputs control signals via the terminal part 12 to the source driver 3 and the gate drivers 11. The control signals include a start pulse signal, an end pulse signal, a reset signal (CLR), a clock signal, a data signal, and the like.

The power source 5 supplies a high-level DC voltage signal VDD and a low-level DC voltage signal VSS as the power source voltage signals via the terminal part 12 to the gate drivers 11.

The terminal part 12 supplies the control signals from the display control circuit 4 and the DC voltage signals (VDD, VSS) from the power source 5 via the lines 15L to the gate driver 11.

Further, though illustration is omitted in FIG. 3, in the frame region on the side where the source driver 3 is provided, on the active matrix substrate 20a, a terminal part is formed that connects the source driver 3 and each source line 15S. The source driver 3 receives the control signals from the display control circuit 4, and inputs data signals via the terminal part (not shown) to the respective source lines 15S.

According to the control signals input via the lines 15L, the gate driver 11 charges a gate line 13G to be scanned, to a potential of either one of the high level and the low level. The state where the gate line 13G is charged to the high level potential is a selected state where the gate line 13G is selected. The state where the gate line 13G is charged to the low level potential is a non-selected state where the gate line 13G is not selected.

The gate driver 11 includes a plurality of switching elements. The high-charge drive circuit 11a includes a switching element to which a high-level DC voltage signal VDD (first DC voltage signal) is supplied via the line 15L from the power source 5. The low-charge drive circuit 11b includes a switching element to which a low-level DC voltage signal VSS (second DC voltage signal) is supplied via the line 15L from the power source 5. The shift register 11c includes switching elements to which the clock signal and the reset signal are supplied via the line 15L from the display control circuit 4. The DC voltage signal VDD (power source voltage VDD) corresponds to a voltage with which the gate line 13G is put into the selected state. The DC voltage signal VSS (power source voltage VSS) corresponds to a voltage with which the gate line 13G is put into the non-selected state. Hereinafter, the DC voltage signal VDD is referred to as a "selection signal", the DC voltage signal VSS is referred to as a "non-selection signal", and the selected state is referred to as "driving of the gate line 13G", in some cases.

When the shift register 11c operates in response to the clock signal and the reset signal supplied thereto, the gate driver 11 charges the gate line 13G to the high-level potential VDD by using the high-charge drive circuit 11a, and charges the gate line 13G to the low-level potential VSS by using the low-charge drive circuit 11b.

In the example illustrated in FIG. 3, two gate drivers 11 are connected to each gate line 13G, but one gate driver 11 may be connected to one gate line 13G, or three or more gate drivers 11 may be connected thereto. The gate drivers 11 connected to the same gate line 13G are synchronized, and in response to selection signals output from these gate drivers 11, one gate line 13G is simultaneously charged to a high-level potential, and in response to non-selection signal output from these gate drivers 11, one gate line 13G is simultaneously charged to a low level. In the present embodiment, Regarding one gate line 13G, two gate drivers 11 are connected to the gate line 13G at approximately equal pitches. The two gate drivers 11 are connected to the gate line 13G at such positions that respective loads exerted on the gate drivers 11 when driving the gate line 13G are approximately equal to each other.

(Configuration of Gate Driver)

Figure 4:
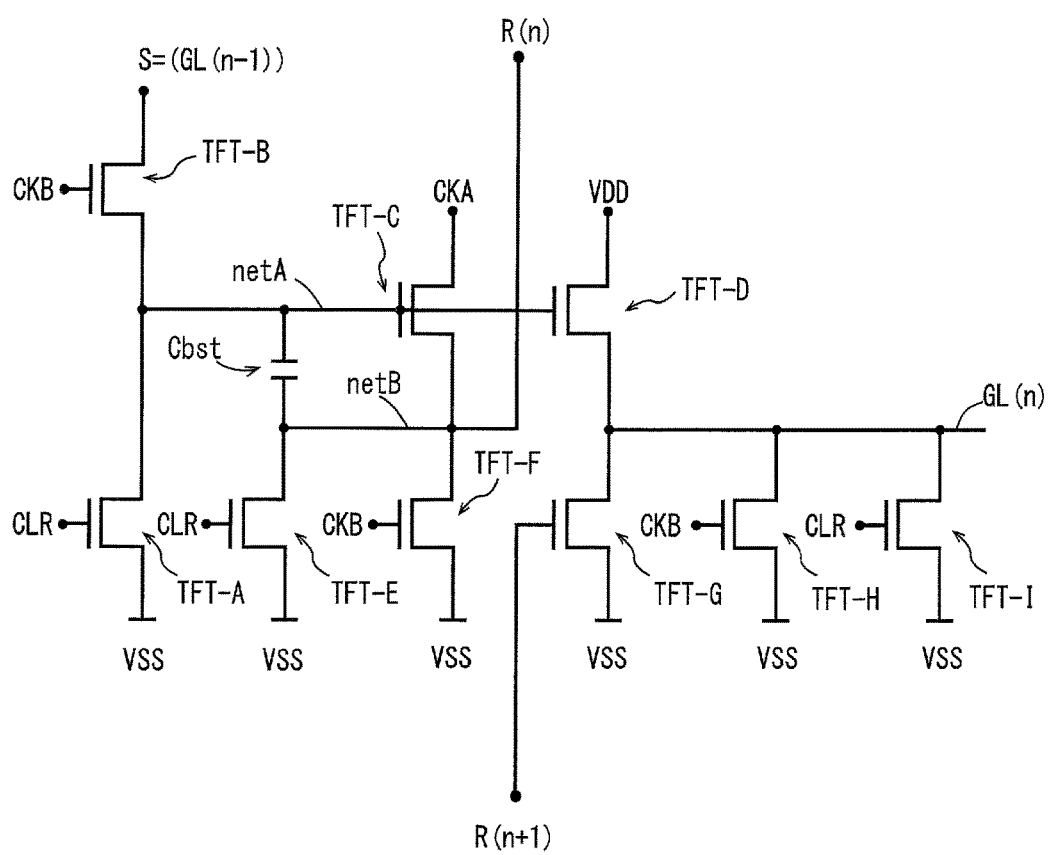
FIG. 4 illustrates an example of an equivalent circuit of the gate driver illustrated in FIG. 3.

Here, a specific configuration example of the gate driver 11 in the present embodiment is described. FIG. 4 illustrates an exemplary equivalent circuit of the gate driver 11. Hereinafter, the configuration of the gate driver 11 that scans a gate line 13G of GL(n) ($1 \leq n \leq N$) is described.

As illustrated in FIG. 4, the gate driver 11 includes thin film transistors (TFT) as a plurality of switching elements, which are TFT-A to TFT-I, and a capacitor Cbst. The gate driver 11 is formed with the transistors TFT-A to TFT-I and the capacitor Cbst connected to one another by lines.

As illustrated in FIG. 4, in this example, a line portion (an internal node) to which the drain terminal of the TFT-A, the source terminal of the TFT-B, one of the electrodes of the capacitor Cbst, and the respective gate terminals of the TFT-C and the TFT-D are connected is referred to as a "net A". Further, a line portion (internal node) to which the other electrode of the capacitor Cbst, the respective drain terminals of the TFT-E and the TFT-F, and the source terminal of the TFT-C are connected is referred to as a "net B". The potential of the net B is input, as R(n) signal, to the gate driver 11 that scans the gate line 13G of the previous stage GL(n−1).

The drain terminal of the TFT-A is connected to the net A. The reset signal is supplied to the gate terminal of the TFT-A, and the power source voltage VSS is supplied to the source terminal thereof.

The drain terminal of the TFT-B is connected to the gate line 13G of GL(n−1), that is, the gate line 13G of the previous stage, and the set signal S exhibiting the potential of the gate line 13G of the previous stage is input thereto. To the gate terminal of the TFT-B, the clock signal (CKB) is supplied, and the source terminal thereof is connected to the net A. It should be noted that to the drain terminal of the TFT-B of the gate driver 11, which scans the first gate line 13G, a start pulse signal is input from the display control circuit 4.

The gate terminal of the TFT-C is connected to the net A, and the source terminal thereof is connected to the net B. To the drain terminal of the TFT-C, the clock signal (CKA) is supplied.

The gate terminal of the TFT-D is connected to the net A, and the source terminal thereof is connected to the gate line 13G of GL(n). To the drain terminal of the TFT-D, the power source voltage VDD is supplied.

One of the electrodes of the capacitor Cbst is connected to the net A, and the other electrode thereof is connected to the net B.

The drain terminal of the TFT-E is connected to the net B. To the gate terminal of the TFT-E, the reset signal is supplied, and to the source terminal thereof, the power source voltage VSS is supplied.

The drain terminal of the TFT-F is connected to the net B. To the gate terminal of the TFT-F, the clock signal (CKB) is supplied, and to the source terminal, the power source voltage VSS is supplied.

The drain terminal of the TFT-G is connected to the gate line 13G of GL(n). To the gate terminal of the TFT-G, the potential of the net B of the gate driver 11 connected to the gate line 13G of GL(n+1) (hereinafter referred to as a "next-stage gate driver") is supplied, and to the source terminal thereof, the power source voltage VSS is supplied. It should be noted that to the gate terminal of the TFT-G of the gate driver 11 that scans the N'th gate line 13, an end pulse signal is input from the display control circuit 4.

The drain terminal of the TFT-H is connected to the gate line 13G of GL(n). To the gate terminal of the TFT-H, the clock signal (CKB) is supplied, and to the source terminal thereof, the power source voltage VSS is supplied.

The drain terminal of the TFT-I is connected to the gate line 13G of GL(n). To the gate terminal of the TFT-I, the reset signal is supplied, and to the source terminal thereof, the power source voltage VSS is supplied.

Figure 6:
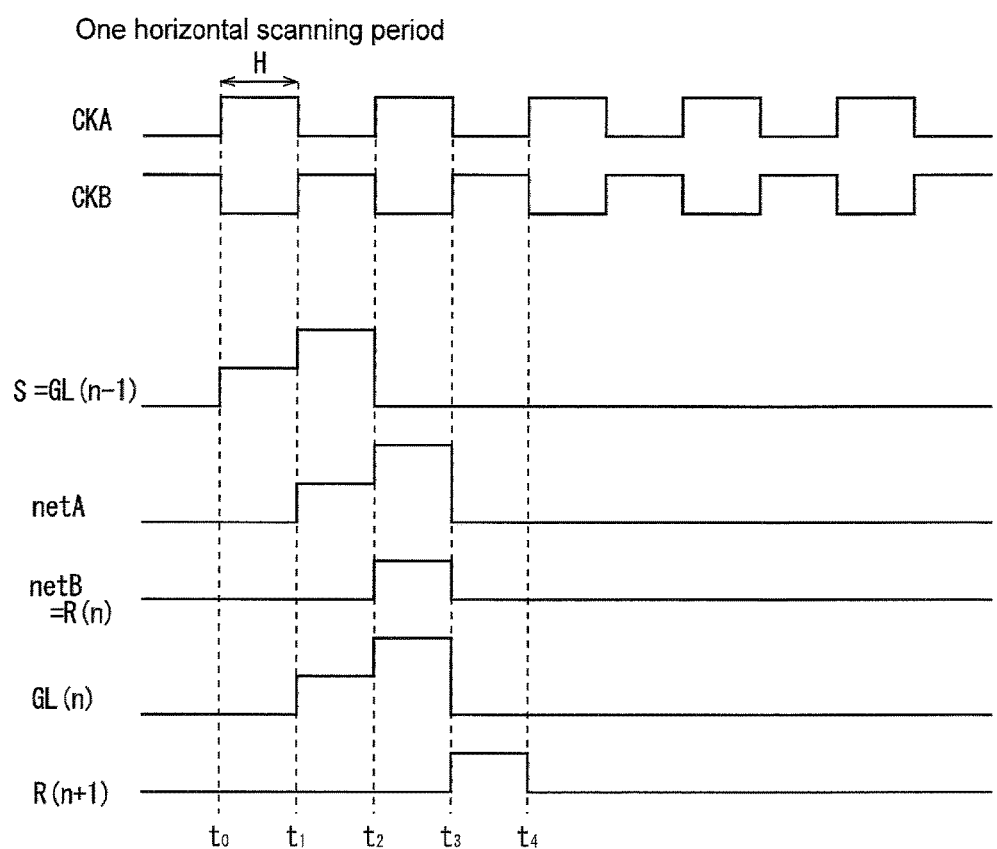
FIG. 6 is a timing chart showing operations of the gate driver illustrated in FIG. 4.

The clock signal (CKA) and the clock signal (CKB) are two-phase clock signals whose phases are inverted every horizontal scanning period (see FIG. 6). Further, the high level of the clock signals CKA and CKB corresponds to the power source voltage VDD, and the low level thereof corresponds to the power source voltage VSS.

In the present example, the TFT-D is a switching element that composes the high-charge drive circuit 11a, and the TFT-G is a switching element that composes the low-charge drive circuit 11b. Further, the switching elements other than the TFT-D and the TFT-G (TFTs-A to C, E, F, H, I) and the capacitor Cbst are elements composing the shift register 11c.

Figure 5:
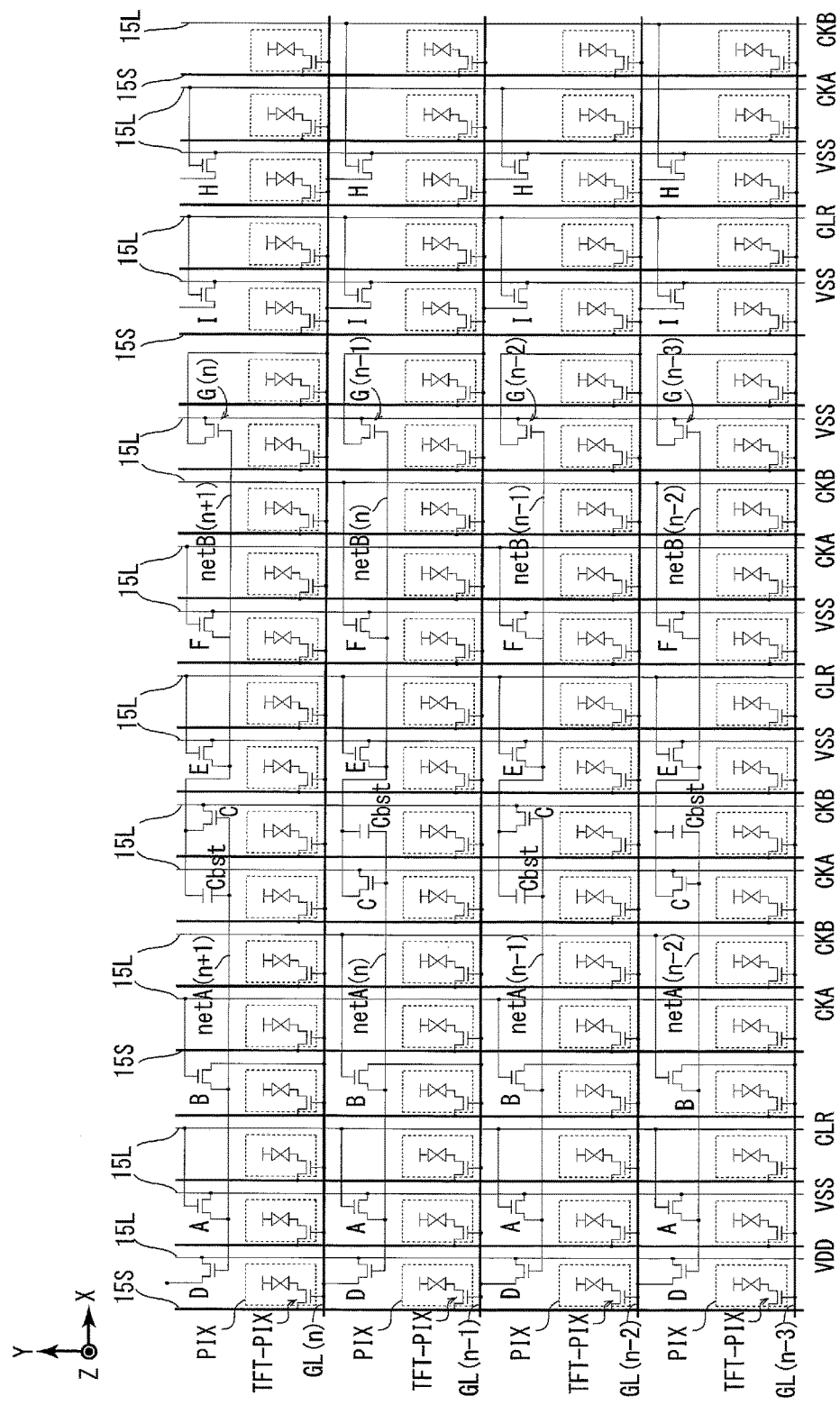
FIG. 5 is a schematic diagram that illustrates an example of arrangement of gate drivers illustrated in FIG. 4 in a display area.

Here, an example of arrangement of the gate drivers 11 illustrated in FIG. 4 in the display area is illustrated in FIG. 5. FIG. 5 schematically illustrates a part of pixel areas where the gate drivers 11 are formed, in the display area of the active matrix substrate 20a.

The thick lines parallel to the Y axis in FIG. 5 indicate the source lines 15S, and the thick lines parallel to the X axis therein indicate the gate lines 13G. In FIG. 5, in each pixel PIX surrounded by the gate lines 13G and the source lines 15S, a switching element TFT-PIX for displaying an image is formed. The gate terminal of the TFT-PIX is connected to the gate line 13G, and the source terminal thereof is connected to the source line 15S. Further, the drain terminal of the pixel switching element TFT-PIX is connected to a pixel electrode that is not shown.

In FIG. 5, in the indications of the TFTs-A to I, the description of "TFT-" is omitted. The switching elements (TFTs-A to I) and the capacitor Cbst composing one gate driver 11 are distributedly arranged over a plurality of pixels in each line. Among these pixels, in the pixel in which the switching elements (TFTs-A to C, E to I) that receive any of the clock signals (CKA, CKB), the reset signal (CLR), and the power source voltage signals (VDD, VSS) are arranged, or in the vicinities of the pixel, lines 15L that supply these signals are formed.

In the present embodiment, as illustrated in FIG. 5, the switching elements to which the clock signals (CKA, CKB) are supplied are arranged in such a manner that the phases of the clock signals (CKA, CKB) supplied to the gate drivers 11 formed in each line are opposite to the phases of the clock signals (CKA, CKB) supplied to the gate drivers 11 in the adjacent line.

More specifically, the gate terminal of the TFT-B of the gate driver 11 that is arranged between the gate lines 13G of GL(n) and GL(n−1) and that scans the gate line 13G of GL(n) is connected to the line 15L that supplies the clock signal (CKB). On the other hand, the gate terminal of the TFT-B of the gate driver 11 that is arranged between the gate lines 13G of GL(n−1) and GL(n−2) and that scans the gate line 13G of GL(n−1) (hereinafter referred to as a "previous-stage gate driver") is connected to the line 15L that supplies the clock signal (CKA). Further, the drain terminal of the TFT-C of the gate driver 11 that scans the gate line 13G of GL(n) is connected to the line 15L that supplies the clock signal (CKA), while the drain terminal of the TFT-C of the previous-stage gate driver 11 is connected to the line 15L that supplies the clock signal (CKB).

Further, as illustrated in FIG. 5, the lines of the net A and the net B are formed so as to be parallel to the gate lines 13G, over pixel areas where the elements (TFTs-A to G, Cbst) connected to the net A and the net B are arranged.

It should be noted that, as illustrated in FIG. 5, the TFT-G (G(n)) of the gate driver 11 that scans the gate line 13G of GL(n) is formed between the gate line 13G of the next stage (GL(n+1)) and the gate line 13G of GL(n). The drain terminal of the TFT-G (G(n)) is connected to the gate line 13G of GL(n), and the gate terminal thereof is connected to the net B(n+1) of the next-stage gate driver 11.

In the active matrix substrate 20a, the elements composing the gate drivers 11 are formed in the same layer as that for the TFTs-PIX, and pixel electrodes (not shown) are formed in a layer above the gate drivers 11 and the TFTs-PIX. Further, the lines 15L are formed in the source layer in which the source lines 15S are formed in the active matrix substrate 20a, and the lines of the net A and the net B are formed in the gate layer in which the gate lines 13G are formed.

As illustrated in FIG. 5, in the present embodiment, the gate drivers 11 and the lines 15L are formed in the pixels. If the gate drivers 11 and the pixel electrodes (not shown) mutually interference, image display cannot be performed appropriately. To cope with this, a shielding layer (not shown) that is formed with a transparent conductive film of, for example, ITO is formed between the gate drivers 11 and the lines 15L on one hand and the pixel electrodes (not shown) on the other hand. This reduces interface between the gate drivers 11 and the pixel electrodes (not shown).

(Operations of Gate Drivers 11)

Next, the operations of one gate driver 11 are described with reference to FIGS. 4 and 6. FIG. 6 is a timing chart illustrating the driving timings of the gate driver 11. Though not shown in FIG. 6, the reset signal (CLR), which is at a high level for a certain set period every vertical scanning period, is input from the display control circuit 4 to the gate driver 11. In response to the input of the reset signal (CLR), the potentials of the net A, the net B, and the gate line 13G make a transition to the low level (VSS).

When the start pulse signal is output form the display control circuit 4 and the clock signals (CKA, CKB) are output, then, the gate drivers 11 are sequentially driven, from the gate driver that scans the gate line 13G of GL(1). Hereinafter, an exemplary operation of one gate driver 11 that scans gate line 13G of GL(n) ($2 \leq n \leq N-1$) is described.

At the time t0 in FIG. 6, the set signal S exhibiting the potential of the gate line 13G of the previous stage (GL(n−1)) is input to the drain terminal of the TFT-B of the gate driver 11. The potential of the set signal S input then is a precharge voltage that is higher than the low level (VSS) and lower than the high level (VDD). At the time t0, the clock signal (CKB) to be input to the gate terminal of the TFT-B is at the low level, and the TFT-B is in an OFF state. The set signal S, therefore, is not input to the TFT-B, and the potential of the net A is maintained at the low level.

Here, the low-level potential of the net A is input to the gate terminals of the TFTs-C and D, whereby the TFTs-C and D are turned OFF. Further, the TFTs-F, H to whose gate terminals the clock signal (CKB) is input are turned OFF as well. This allows the potentials of the net B and the gate line 13G of GL(n) to be maintained at the low level, as shown in FIG. 6.

Next, at the time t1, the clock signal (CKB) at the high level and the clock signal (CKA) at the low level are input to the gate driver 11. The TFTs-B, F, H are turned ON. Then, the set signal S is input to the drain terminal of the TFT-B. The potential of the set signal S input here is the high-level potential (VDD), with which the gate line 13G in the previous stage is put into the selected state. This causes the net A to be precharged so that the potential thereof becomes "VDD-Vth". Here, Vth represents a threshold voltage of the TFT-B or the like.

The charging of the net A to "VDD-Vth" causes the TFT-D to be turned ON, which causes the power source voltage VDD to be input from the drain terminal of the TFT-D. Then, the gate line 13G of GL(n) is precharged so that the potential thereof becomes "VDD-Vth×2". Here, since the TFT-H is turned ON and the source terminal of the TFT-H is grounded at the power source voltage VSS, the potential of the gate line 13G of GL(n) is put into an unstable state. Further, since the TFT-C and the TFT-F are also turned ON here, the clock signal (CKA) at the low level is input to the drain terminal of the TFT-C, and the potential of the net B is maintained at the low level.

Subsequently, at the time t2, the clock signal (CKB) at the low level and the clock signal (CKA) at the high level are input to the gate driver 11. The TFT-B, the TFT-F, and the TFT-H are turned OFF. The TFT-C is in the ON state due to the precharge by the net A, which causes the clock signal (CKA) at the high level to be input to the drain terminal of the TFT-C. This causes the potential of the net B to increase, and the potential of the net A is boosted up via the capacitor Cbst, whereby the net A is charged to a potential greater than VDD. Then, a potential sufficiently greater than VDD is input to the gate terminal of the TFT-D, whereby the TFT-D is turned ON. Consequently, the power source voltage VDD is applied to the drain terminal of the TFT-D, the gate line 13G of GL(n) is charged to the high-level potential (VDD). In other words, the gate line 13G of GL(n) makes a transition to the selected state.

Further, here, the potential of the net B is input, as a R(n) signal, to the gate driver 11 that scans the gate line 13G of the previous stage (GL(n−1)). With this, the gate driver 11 of the previous stage charges the gate line 13G of GL(n−1) thereby changing the potential thereof to the low level (VSS), to switch the gate line 13G of GL(n−1) to the non-selected state.

Next, at the time t3, the clock signal (CKB) at the high level and the clock signal (CKA) at the low level are input to the gate driver 11. The TFT-B is turned ON, and from the drain terminal of the TFT-B, the set signal S is input, which exhibits the potential (VSS) of the gate line 13G of the previous stage (GL(n−1)). This causes the potential of the net A to falls to VSS, and the TFT-C and the TFT-D are turned OFF. Further, the TFT-F is turned ON, and the potential of the net B falls to VSS.

Further, here, to the gate terminal of the TFT-G, a R(n+1) signal is input, which exhibits a potential of the gate line 13G of GL(n+1), that is, the net B of the next-stage gate driver 11. The potential of the R(n+1) signal at the time t3 is at the high level. In other words, the gate line 13G of GL(n+1) is in the selected state. At this timing, the TFT-G is turned ON. Further, the clock signal (CKB) at the high level is input to the gate terminal of the TFT-H, whereby the TFT-H is also turned ON. This causes the gate line 13G of GL(n) is charged to the low level (VSS). In other words, the gate line 13G of GL(n) makes a transition to the non-selected state.

It should be noted that, in this example, after the driving of the gate line 13G of GL(n), the gate line 13G of GL(n) is charged to the low level (VSS) by the TFTs-G, H, during a period while the gate line 13G of the next stage is being selected. Both of the TFTs-G and H charge the gate line 13G of GL(n) to the low level, but the use thereof are different. The TFT-G is turned ON at the timing when the gate line 13G of the next stage is switched to the selected state, and decreases the potential of the gate line 13G of GL(n) to VSS. In other words, the TFT-G serves as a low-charge drive circuit 11b. On the other hand, the TFT-H is turned ON every time when the clock signal (CKB) is switched to the high level, and decreases the potential of the gate line 13G of GL(n) to VSS. In other words, the TFT-H charges the gate line 13G of GL(n) to a potential at the low level at the same timing as that of the TFT-G, but after the gate line 13G of GL(n) is driven, the TFT-H is used for maintaining the potential of the gate line 13G of GL(n) at the low level.

In Embodiment 1 described above, since the TFT-D (high-charge drive circuit) for charging the gate line 13G to the high-level potential, and the TFT-G (low-charge drive circuit) for charging the gate line 13G to the low-level potential are formed inside the display area, the frame can be narrowed, as compared with the case where these are formed in the frame region outside the display area. Further, as compared with the case where the clock signal is supplied to these switching elements and the gate line 13G is charged to the high-level or low-level potential, the load capacitance of the clock line can be reduced, whereby the electric power consumption can be reduced.

Embodiment 2

Figure 7:
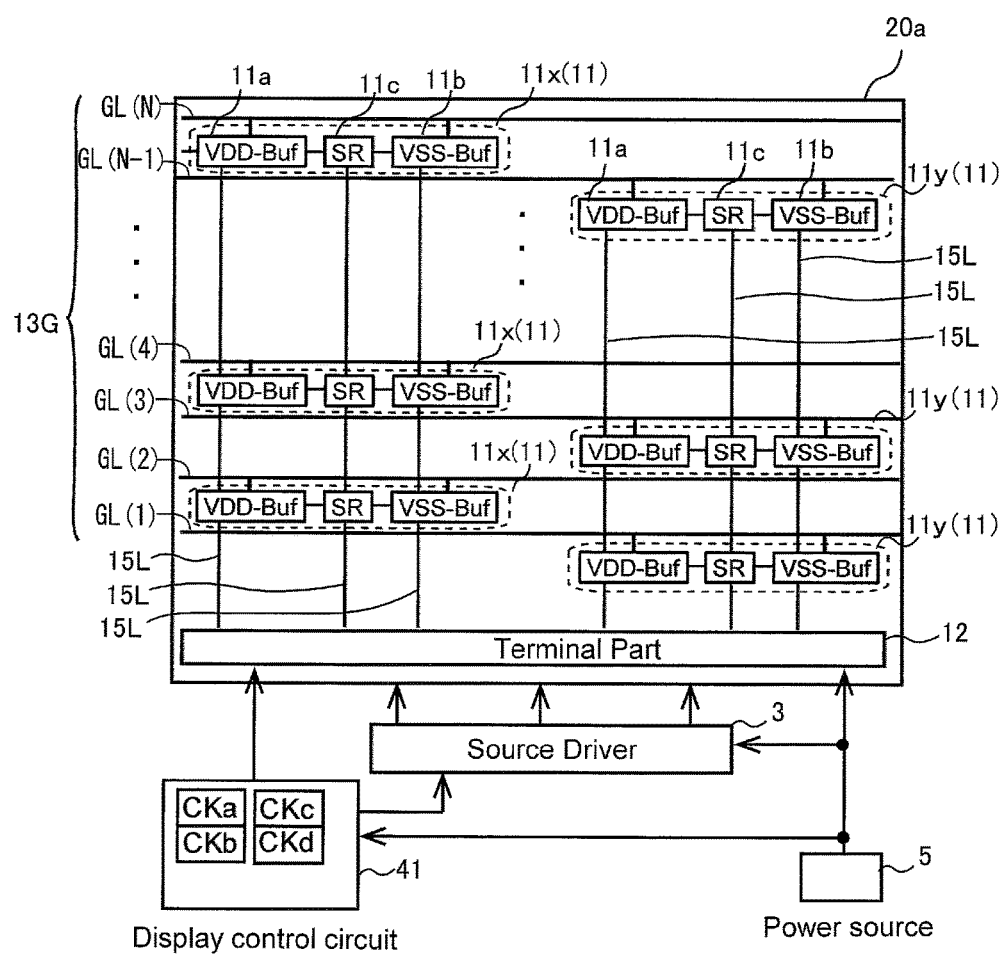
FIG. 7 is a schematic diagram illustrating a schematic configuration of an active matrix substrate in Embodiment 2.

The present embodiment is described below with reference to the example in which the period for charging the gate line 13G is elongated as compared with the case of Embodiment 1 so that the operating margin of the gate driver 11 is improved. FIG. 7 is a top view illustrating a schematic configuration of an active matrix substrate 20a in the present embodiment. As is the case with FIG. 3 mentioned above, in FIG. 7, the illustration of source lines 15S on the active matrix substrate 20a is omitted, and a schematic configuration of parts connected to the active matrix substrate 20a is illustrated.

As illustrated in FIG. 7 as an example, one gate driver 11 is connected to each gate line 13G on the active matrix substrate 20a. In the present embodiment, gate drivers 11x (11) for scanning the even-numbered gate lines 13G (GL(2), (4) . . . (N)), and gate drivers 11y (11) for scanning the odd-numbered gate lines 13G (GL(1), (3) . . . (N−1)) are driven separately.

Figure 10:
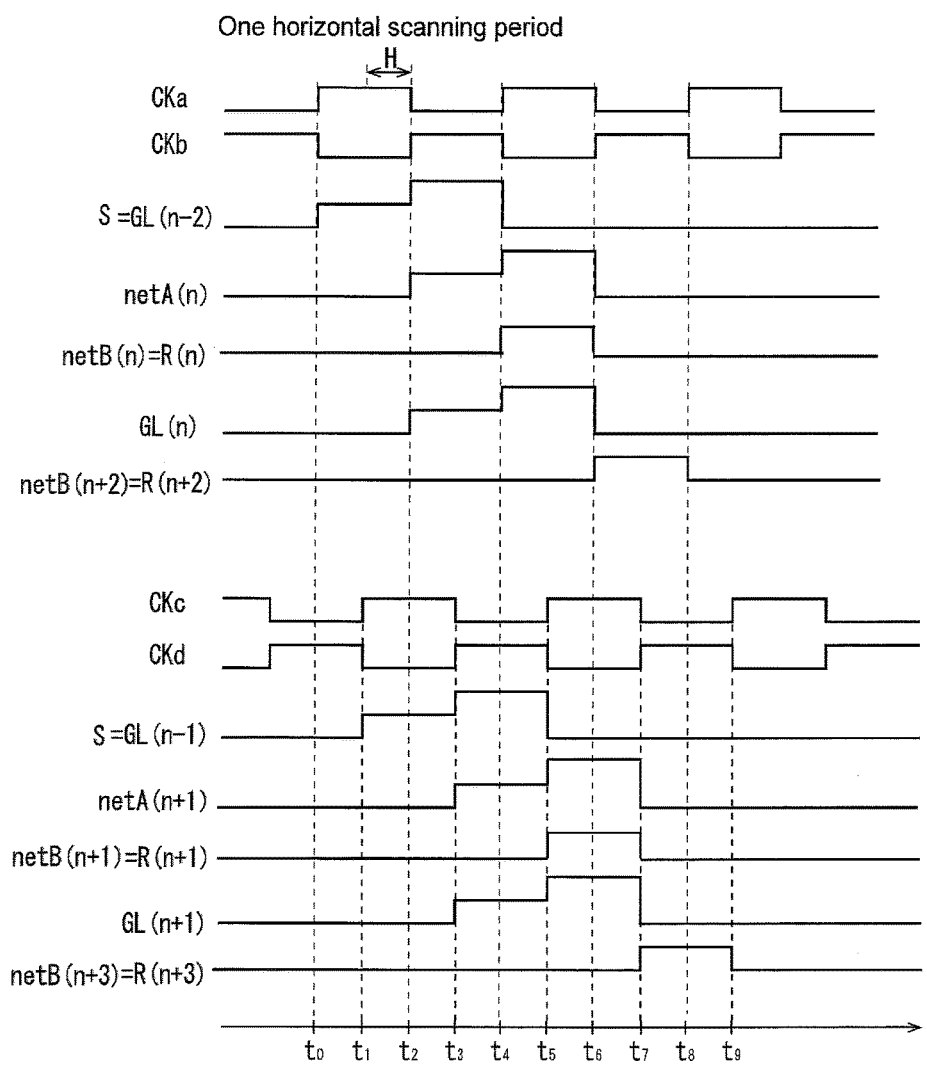
FIG. 10 is a timing chart illustrating operations of the gate drivers shown in FIGS. 8A and 8B.

The display control circuit 41 outputs clock signals (CKa, CKb) (a first clock signal) and clock signals (CKc, CKd) (a second clock signal) (see FIG. 10). The clock signals CKa, CKb are two-phase clock signals whose phases, opposite to each other, are inverted every two horizontal scanning periods. The clock signals CKc, CKd are also two-phase clock signals whose phases, opposite to each other, are inverted every two horizontal scanning periods. In other words, the frequency of the clock signals (CKa, CKb) and the clock signals (CKc, CKd) is ½ of that of the clock signals (CKA, CKB) in Embodiment 1. The phases of the clock signals CKc, CKd are shifted by ¼ cycle with respect to the phases of the clock signals CKa, CKb (see FIG. 10). In the present embodiment, the gate drivers 11x, 11y are driven using the four clock signals (CKa, CKb, CKc, CKd), so as to scan the gate lines 13G.

Both of the gate drivers 11x, 11y have configurations identical to that of the gate driver 11 in Embodiment 1 (see FIG. 4), except that the clock signals supplied to the TFTs-B, C, F, H and the arrangement of the gate drivers 11x, 11y in the display area are different from those in Embodiment 1.

Figure 8A:
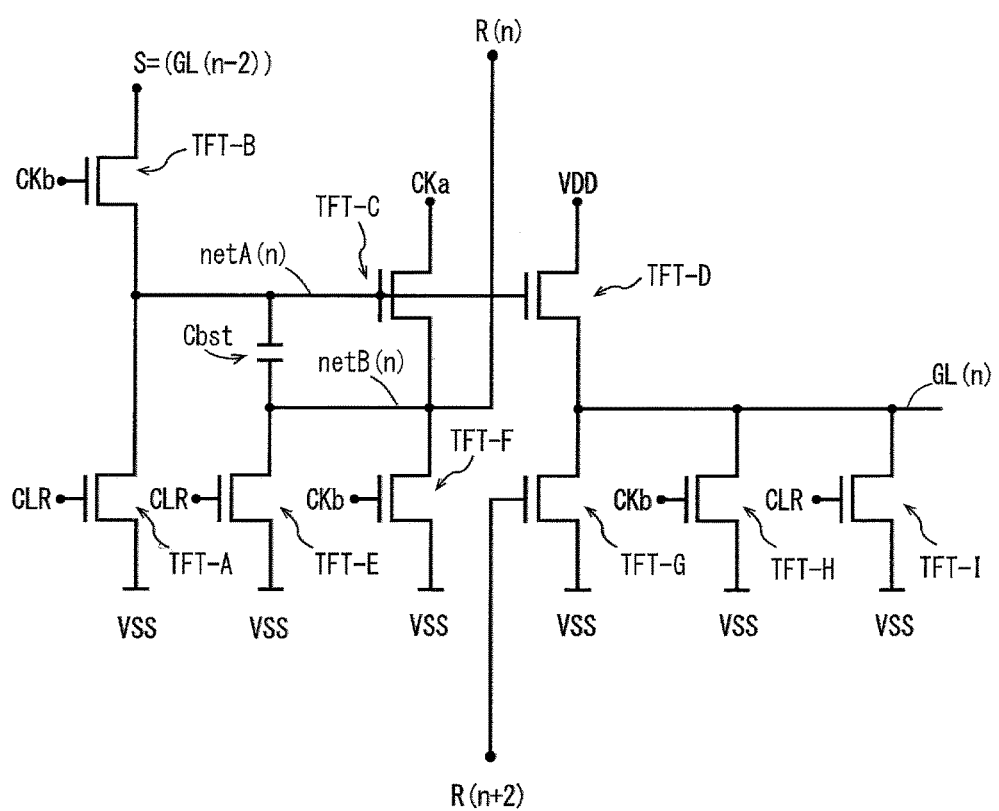
FIG. 8A illustrates an example of an equivalent circuit of the gate driver that scans an even-numbered gate line illustrated in FIG. 7.
Figure 8B:
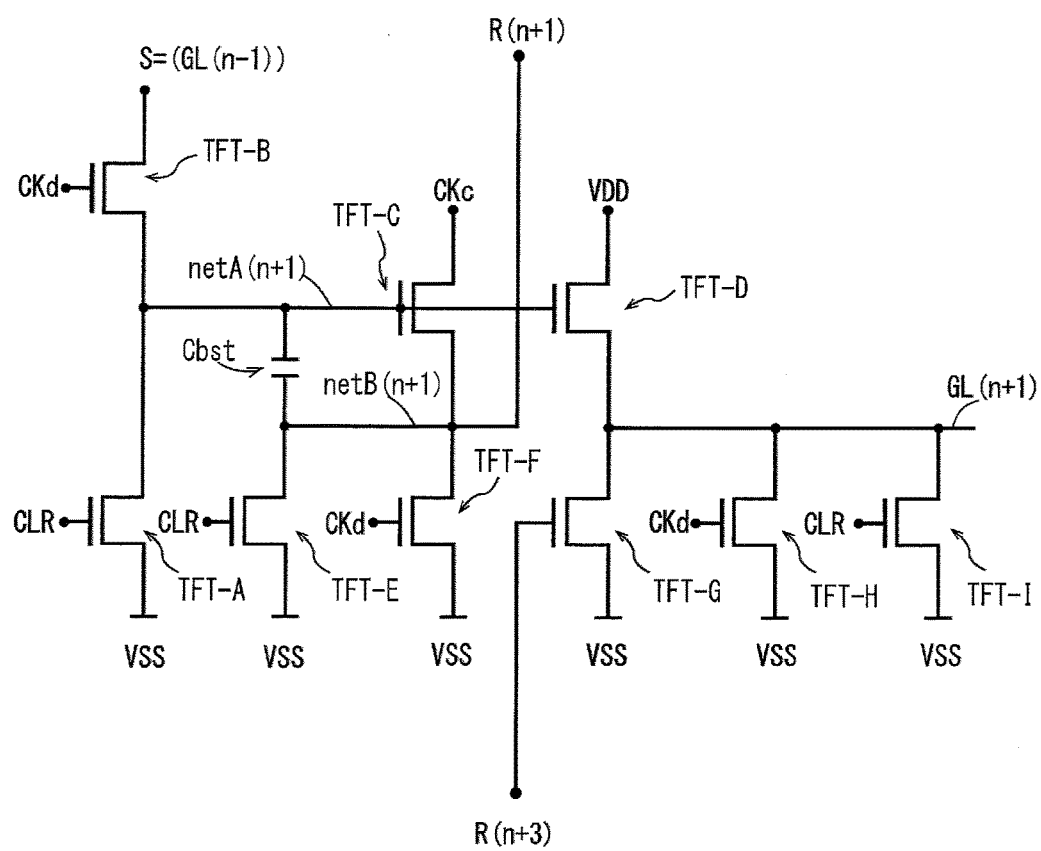
FIG. 8B illustrates an example of an equivalent circuit of the gate driver that scans an odd-numbered gate line illustrated in FIG. 7.

FIG. 8A illustrates an equivalent circuit of the gate driver 11x, and FIG. 8B illustrates an equivalent circuit of the gate driver 11y. As illustrated in FIG. 8A, the clock signal (CKb) is supplied to the gate terminals of the TFTs-B, F, H of the gate driver 11x(n), which scans an even-numbered gate line 13G of GL(n), and the clock signal (CKa) is supplied to the drain terminal of the TFT-C of the same. Further, as illustrated in FIG. 8B, the clock signal (CKd) is supplied to the gate terminals of the TFT-B, F, H of the gate driver 11y(n+1), which scans an odd-numbered gate line 13G of GL(n+1), and the clock signal (CKc) is supplied to the drain terminal of the TFT-C of the same.

Figure 9A:
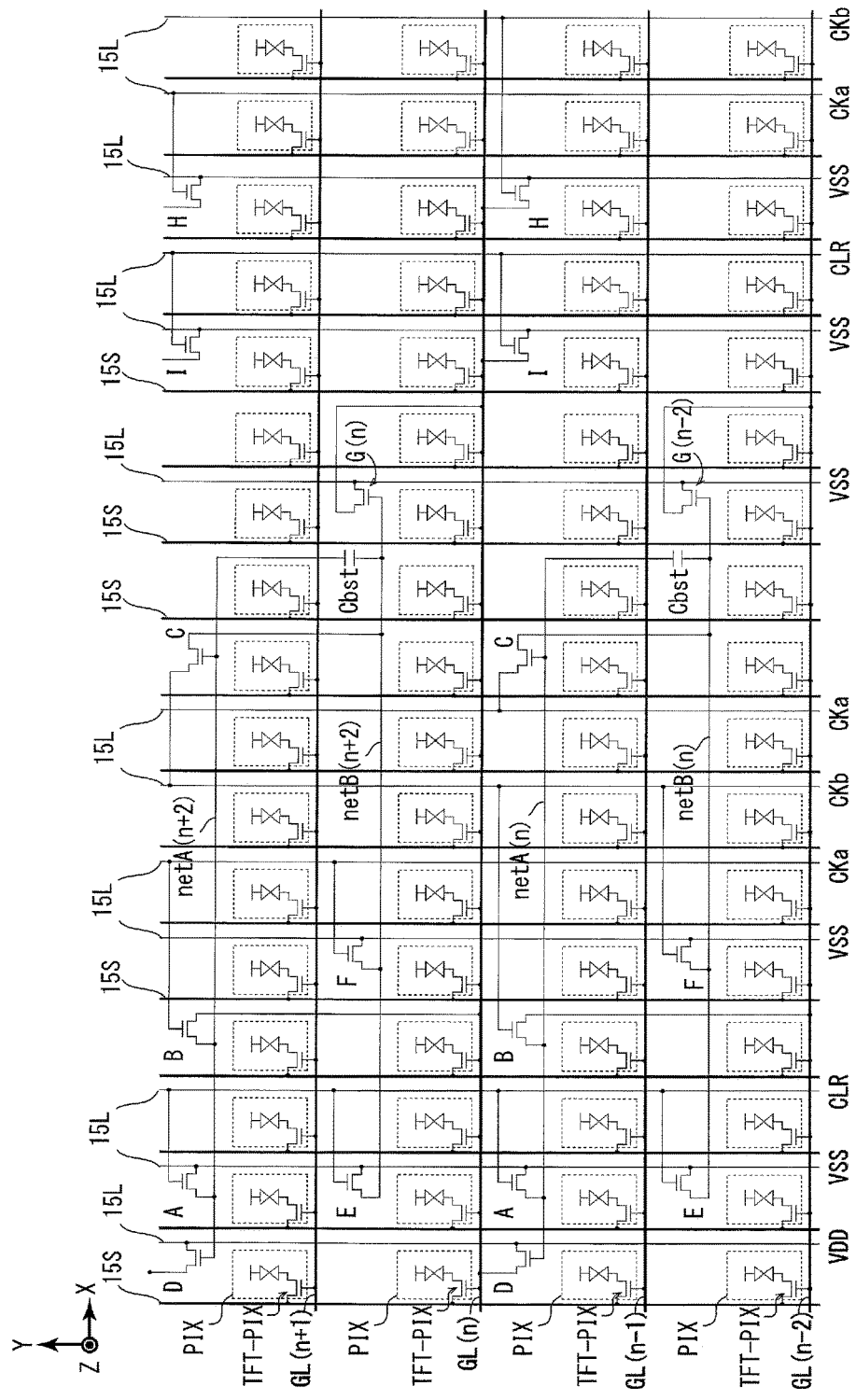
FIG. 9A schematically illustrates an example of arrangement of the gate drivers illustrated in FIG. 8A in the display area.
Figure 9B:
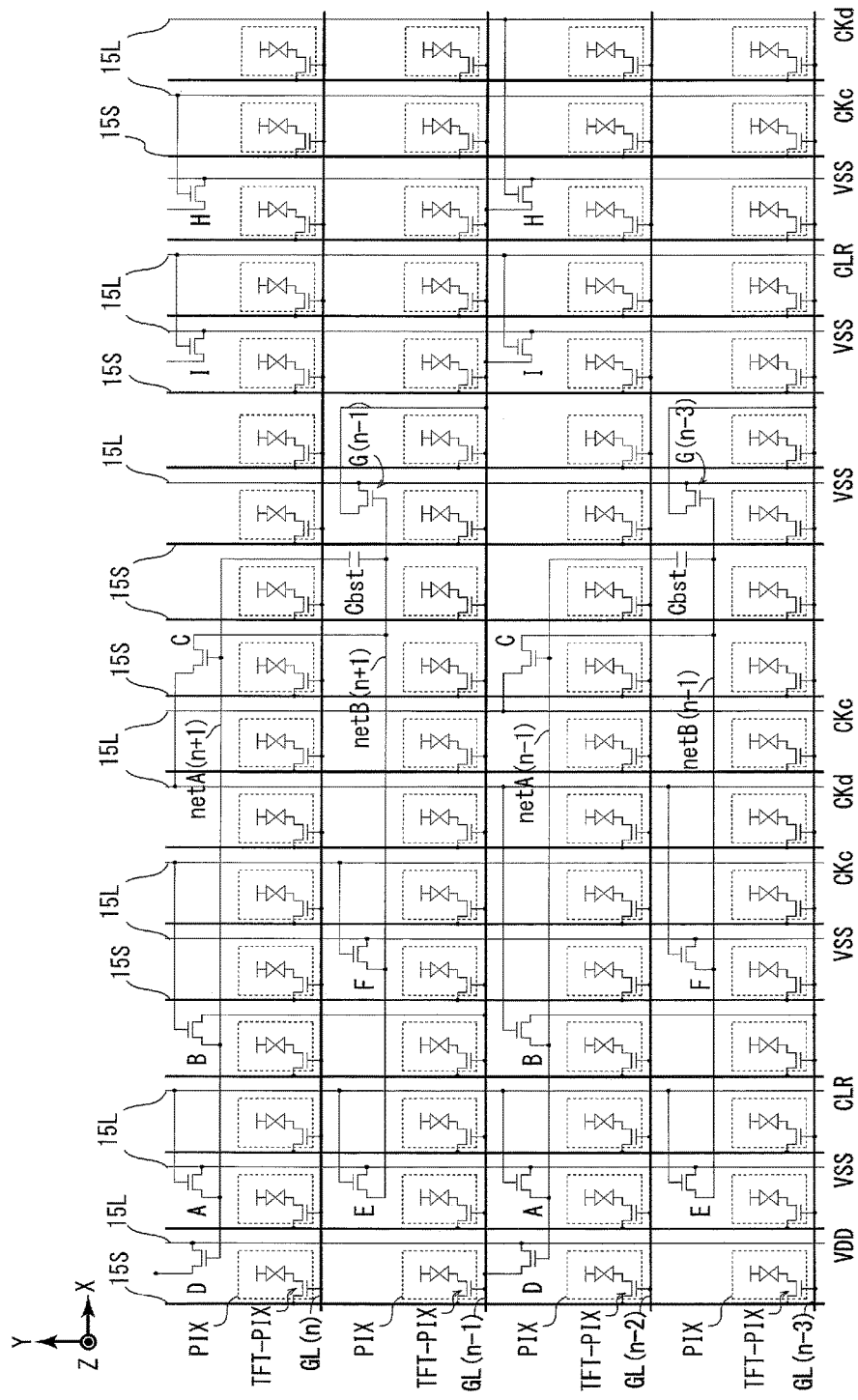
FIG. 9B is a schematic diagram illustrating an example of the arrangement in the display area of the gate driver illustrated in FIG. 8B.

FIG. 9A illustrates an example of arrangement of the gate drivers 11x in the display area, and FIG. 9B is an example of arrangement of the gate drivers 11y in the display area. In FIGS. 9A, 9B, configurations identical to those in Embodiment 1 mentioned above are denoted by the identical reference numerals to those used in Embodiment 1. Further, as is the case with FIG. 5, thick lines parallel to the Y axis in FIGS. 9A, 9B indicate the source lines 15S, and the thick lines parallel to the X axis indicate the gate lines 13G. Further, for convenience sake, in FIGS. 9A, 9B, in the indications of the switching elements that compose the gate drivers 11x, 11y, the description of "TFT-" is omitted.

In FIG. 9A, the TFTs-A to I and the capacitor Cbst, which compose one gate driver 11x, are distributedly formed over two rows of pixels. More specifically, the TFTs-A to C, the TFT-D, the TFT-H, and the TFT-I of the gate driver 11x(n) that scans the gate line 13G of GL(n) in FIG. 8A is formed between the gate lines 13G of GL(n) and GL(n−1). Further, the TFT-E, the TFT-F, and the capacitor Cbst of the gate driver 11x(n) are formed between the gate lines 13G of GL(n−1) and GL(n−2). The TFT-G (G(n)) of the gate driver 11x(n) is formed between the gate lines 13G of GL(n+1) and GL(n), and is connected to the net B(n+2) of the gate driver 11x(n+2), which scans the gate line 13G of GL(n+2) and the gate line 13G of GL(n).

The line of the net A to which the TFTs-A to D of the gate driver 11x(n) are connected is drawn to one of electrodes of the capacitor Cbst. The line of the net B to which the TFTs-E, F of the gate driver 11x(n) and the other electrode of the capacitor Cbst of the same are connected is formed between the gate lines 13G of GL(n−1) and GL(n−2).

The TFTs-A to I and the capacitor Cbst that compose one gate driver 11y are also distributedly formed over two rows of pixels, as is the case with FIG. 9A, as illustrated in FIG. 9B. The TFTs-A to D, H, I of the gate driver 11y(n−1) that scans the gate line 13G of GL(n−1) in FIG. 9B are formed between the gate lines 13G of GL(n−1) and GL(n−2). Further, the TFTs-E, F, and the capacitor Cbst of the gate driver 11y(n−1) are formed between the gate lines 13G of GL(n−2) and GL(n−3). The TFT-G (G(n−1)) of the gate driver 11y(n−1) is formed between the gate lines 13G of GL(n) and GL(n−1). The TFT-G (G(n−1)) is connected to the net B(n+1) of the gate driver 11y(n+1) that scans the gate line 13G of GL(n+1) and to the gate line 13G of GL(n−1).

In the present embodiment as well, as illustrated in FIG. 9A, the switching element of the gate driver 11x is arranged so that the clock signals (CKa, CKb) supplied to the gate driver 11x(n) have phases opposite to those of the clock signals (CKa, CKb) supplied to the gate driver 11x that scans the gate line 13G of GL(n+2) or GL(n−2). Besides, as illustrated in FIG. 9B, the switching element of the gate driver 11y is arranged so that the clock signals (CKc, CKd) supplied to the gate driver 11y(n−1) have phases opposite to those of the clock signals (CKc, CKd) supplied to the gate driver 11y that scans the gate lines 13G of GL(n+1) or GL(n−3).

(Operations of Gate Drivers 11x, 11y)

Next, operations of the gate drivers 11x, 11y in the present embodiment are described with reference to FIGS. 8A, 8B, and 10. FIG. 10 is a timing chart showing the driving timings for driving the gate driver 11x(n) that scans the gate line 13G of GL(n), and the gate driver 11y(n+1) that scans the gate line 13G of GL(n+1).

Though illustration is omitted in FIG. 10, the reset signal (CLR), which is maintained at a high level for a certain set period every vertical scanning period is input from the display control circuit 4 to the gate drivers 11x(n) and 11y(n+1). Upon the input of the reset signal (CLR), the potentials of the net A(n), the net B(n), the net A(n+1), the net B(n+1), the gate line 13G of GL(n), and the gate line 13G of GL(n+1) make a transition to the low level (VSS). It should be noted that the high levels of the clock signals CKa, CKb, CKc, and CKd correspond to the power source voltage VDD, and the low levels thereof correspond to the power source voltage VSS.

The start pulse signal is output from the display control circuit 41, and the clock signals (CKa, CKb) and the clock signals (CKc, CKd) are output, whereby the gate drivers 11 are sequentially driven, starting from the gate driver 11 that scans the gate line 13G of GL(1).

At the time t0 in FIG. 10, the set signal S(GL(n−2)), which exhibits the potential of the gate line 13G of GL(n−2), is input to the drain terminal of the TFT-B of the gate driver 11x(n) illustrated in FIG. 8A. The potential of the set signal S(GL(n−2)) input here is the potential of the precharge voltage. At the time t0, the clock signal (CKb) input to the gate terminal of the TFT-B is at the low level, and the TFT-B is in the OFF state. The set signal S (GL(n−2)) therefore is not input to the TFT-B, whereby the potential of the net A(n) is maintained at the low level (VSS).

On the other hand, at the time t0, the clock signal (CKd) is at the high level, and the clock signal (CKc) is at the low level. The TFT-B of the gate driver 11y(n+1) illustrated in FIG. 8B is in the ON state, and the set signal S(GL(n−1)) that exhibiting the potential of the gate line 13G of GL(n−1) is input to the drain terminal of the TFT-B. Here, the potential of the set signal S(GL(n−1)) is at the low level (VSS), and the potential of the net A(n+1) of the gate driver 11y(n+1) is maintained at the low level (VSS). Further, here, since the TFTs-F, H are turned ON, the potentials of the net B(n+1) and the gate line of GL(n+1) are maintained at the low level (VSS).

At the time t1, the clock signal (CKc) shifts to the high level, and the clock signal (CKd) shifts to the low level, whereby the set signal S(GL(n−1)) rises to the precharge voltage for the gate line 13G of GL(n−1). Since the TFT-B of the gate driver 11y(n+1) is turned OFF, the set signal S(GL(n−1)) is not input, and the potential of the net A(n+1) is maintained at the low level.

At time t2, the clock signal (CKa) shifts to the low level, the clock signal (CKb) shifts to the high level, and the set signal S(GL(n−2)) rises to the potential (VDD) for the selected state of the gate line 13G of GL(n−2). This causes the TFTs-B, F, H of the gate driver 11x(n) to be turned ON, and the set signal S(GL(n−2)) is input to the drain terminal of the TFT-B. Consequently, the net A(n) is precharged so that the potential thereof becomes "VDD-Vth". It should be noted that "Vth" represents the threshold voltage for the TFT-B and the like.

Then, at the time t3, the clock signal (CKc) shifts to the low level, the clock signal (CKd) shifts to the high level, and the set signal S(GL(n−1)) rises to the potential (VDD) of the gate line 13G of GL(n−1) in the selected state. This causes the TFTs-B, F, H of the gate driver 11y(n+1) to be turned ON, and the set signal S(GL(n−1)) is input to the drain terminal of the TFT-B. Consequently, the net A(n+1) is precharged so that the potential thereof becomes "VDD-Vth".

At the time t4, the clock signal (CKa) shifts to the high level, and the clock signal (CKb) shifts to the low level. This causes the TFT-B, the TFT-F, and the TFT-H of the gate driver 11x(n) to be turned OFF. Since the TFT-C of the gate driver 11x(n) is in the ON state due to precharge of the net A(n), the clock signal (CKa) at the high level is input to the drain terminal of the TFT-C. This causes the potential of the net B(n) to rise, the potential of the net A(n) is boosted via the capacitor Cbst, and the net A(n) is charged to a potential greater than VDD. Then, the potential sufficiently greater than VDD is input to the gate terminal of the TFT-D of the gate driver 11x(n), whereby the power source voltage VDD is applied to the drain terminal of the TFT-D. This causes the gate line 13G of GL(n) to be charged to the high level (VDD).

Then, at the time t5, the clock signal (CKc) shifts to the high level, and the clock signal (CKd) shifts to the low level. This causes the TFTs-B, F, H of the gate driver 11y(n+1) to be turned OFF. Since the TFT-C of the gate driver 11x(n) is in the ON state due to the precharge of the net A(n+1), the clock signal (CKc) at the high level is input to the drain terminal of the TFT-C. This causes the potential of the net B(n+1) to rise, the potential of the net A(n+1) is boosted via the capacitor Cbst, and the net A(n+1) is charged to a potential greater than VDD. Then, the potential sufficiently greater than VDD is input to the gate terminal of the TFT-D of the gate driver 11y(n+1), whereby the power source voltage VDD is applied to the drain terminal of the TFT-D. This causes the gate line 13G of GL(n+1) to be charged to the high level (VDD).

At the time t6, the clock signal (CKa) shifts to the low level, and the clock signal (CKb) shifts to the high level. Since the TFT-B of the gate driver 11x(n) is turned ON, the set signal S(GL(n−2)) is input from the drain terminal of the TFT-B. The set signal S(GL(n−2)) has a potential at the low level (VSS). With this, the potential of the net A(n) falls to VSS, and the TFT-C and the TFT-D are turned OFF. Further, the TFT-F is in the ON state, and the potential of the net B(n) falls to VSS.

At the time t6, to the gate terminal of the TFT-G of the gate driver 11x(n), the R(n+2) signal is input, which exhibits the potential of the net B(n+2) of the gate driver 11x(n+2) that scans the gate line 13G of GL(n+2). At the time t6, the R(n+2) signal rises to the potential (VDD) for the selected state of the gate line 13G of GL(n+2), and the TFT-G is turned ON. Further, since the clock signal (CKb) at the high level (VDD) is input to the gate terminal of the TFT-H, the TFT-H is also turned ON. This causes the gate line 13G of GL(n) to be charged to the low level (VSS).

At the time t7, the clock signal (CKc) shifts to the low level, and the clock signal (CKd) shifts to the high level. The TFT-B of the gate driver 11y(n+1) is turned ON, and the set signal S(GL(n−1)) is input from the drain terminal of the TFT-B. The set signal S(GL(n−1)) has a potential at the low level (VSS). With this, the potential of the net A(n+1) falls to VSS, and the TFTs-C, D are turned OFF. Further, the TFT-F is in the OFF state, and the potential of the net B(n+1) falls to VSS.

At the time t7, to the gate terminal of the TFT-G of the gate driver 11y(n+1), a R(n+3) signal is input, which exhibits the potential of the net B(n+3) of the gate driver 11y(n+3) that scans the gate line 13G of GL(n+3). At the time t7, the R(n+3) signal rises to the potential (VDD) for the selected state of the gate line 13G of GL(n+3), and the TFT-G is turned ON. Further, since the clock signal (CKd) at the high level (VDD) is input to the gate terminal of the TFT-H, the TFT-H is also turned ON. This causes the gate line 13G of GL(n+1) to be charged to the low level (VSS).

At the time t8, the clock signal (CKa) shifts to the high level, the clock signal (CKb) shifts to the low level, and the R(n+2) signal shifts to the low level (VSS). Since this causes the TFTs-B, F, H of the gate driver 11x(n) to be turned OFF and the TFTs-C, D to be turned OFF, the potentials of the net A(n) and the net B(n) are maintained at the low level (VSS). Further, the TFTs-G, H are also turned OFF, and the potential of the gate line 13G of GL(n) is maintained at the low level (VSS).

At the time t9, the clock signal (CKc) shifts to the high level, the clock signal (CKd) shifts to the low level, and the R(n+3) signal shifts to the low level (VSS). Since this causes the TFTs-B, F, H of the gate driver 11y(n+1) to be turned OFF and the TFTs-C, D to be turned OFF, the potentials of the net A(n+1) and the net B(n+1) are maintained at the low level (VSS). Further, the TFTs-G, H are also turned OFF, and the potential of the gate line 13G of GL(n+1) is maintained at the low level (VSS).

Embodiment 2 is described above with reference to an example in which the two types of gate drivers 11x, 11y are driven individually using the four clock signals (CKa, Ckb, CKc, CKd), and the odd-numbered and even-numbered gate lines 13G are scanned individually using the gate drivers 11x, 11y. Since the frequency of the clock signals (CKa, Ckb, CKc, CKd) is ½ of that of the clock signals (CKA, CKB) in Embodiment 1, the frequency of the clock signal can be reduced as compared with Embodiment 1, and the time for charging the gate line 13G, which is twice that of Embodiment 1, can be secured. Consequently, the operating margin of the gate drivers 11x, 11y can be improved.

Embodiment 3

Embodiment 1 is described above with reference to an example in which, as illustrated in FIG. 5, the potential of the internal node net B(n) in the gate driver 11(n) that scans the gate line 13G of GL(n) is output to the TFT-G(n−1) of the previous-stage gate driver 11(n−1), whereby the gate line 13G of the previous stage is charged to the low level. In the case of Embodiment 1, the line of the net B(n) has to be drawn to the TFT-G(n−1), which causes the line of the net B(n) to have a greater parasitic capacitance. The potential of the net B(n) varies depending on the TFT-C. As the parasitic capacitance of the net B(n) increases, the size of the TFT-C has to be increased to enhance the driving capability, but this causes the load on the clock line of the TFT-C to increase, which results in the increase of the electric power consumption. As the present embodiment, a configuration of the gate driver in which the parasitic capacitance of the net B is reduced, as compared with Embodiment 1, is described.

Figure 11:
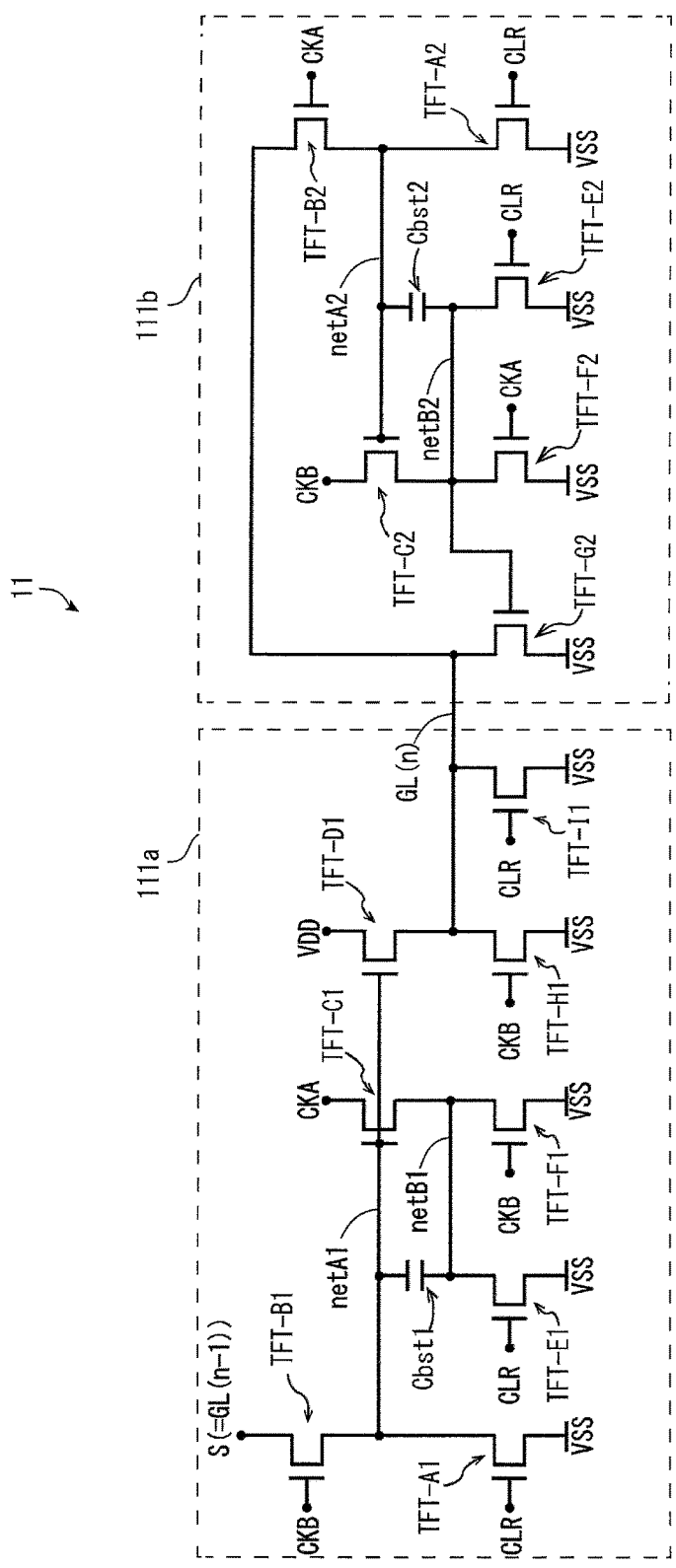
FIG. 11 illustrates an exemplary equivalent circuit of a gate driver in Embodiment 3.

FIG. 11 illustrates an equivalent circuit of a gate driver 11 in the present embodiment. The gate driver 11 illustrated in FIG. 11 scans the gate line 13G of GL(n). As illustrated in FIG. 11, the gate driver 11 includes a high charge driver 111a that charges the gate line 13G to a high-level potential, and a low charge driver 111b that charges the gate line 13G to a low-level potential. The high charge driver 111a and the low charge driver 111b are connected to the gate line 13G of GL(n).

The high charge driver 111a includes TFTs-A1 to F1, H1, I1 formed with thin film switching elements, and a capacitor Cbst1. The names of the TFTs-A1 to F1, H1, I1 and the capacitor Cbst1 are the names of the TFTs-A to F, H, I and the capacitor Cbst shown in FIG. 4 to which "1" is added, respectively, in order to distinguish the same from the gate driver 11 illustrated in FIG. 4, and correspond to the TFTs-A to F, H, I and the capacitor Cbst, respectively.

The line of the net A1 illustrated in FIG. 11 is identical to the line of the net A illustrated in FIG. 4, but the line of the net B1 illustrated in FIG. 11 is different from the line of the net B illustrated in FIG. 4. As illustrated in FIG. 11, the net B1 connects the source terminal of the TFT-C1, the drain terminals of the TFTs-E1 and F1, and the electrode of the capacitor Cbst1 on a side opposite to the net A. In other words, this net B1 is different from the net B illustrated in FIG. 4 on the point that the net B is not connected to the gate driver 11 of the previous stage (GL(n−1)). In the high charge driver 111a, the internal node net A1 has a potential changing depending on the potential of the gate line 13G of GL(n−1) and the clock signal (CKA, CKB). The high charge driver 111a, depending on the potential of the net A1, charges the gate line 13G of GL(n) via the TFT-D1, to the high-level potential (VDD).

On the other hand, the low charge driver 111b includes TFTs-A2 to C2 and TFTs-E2 to G2 formed with thin film switching elements, and a capacitor Cbst2. The names of the TFTs-A2, C2, E2, F2 and the capacitor Cbst2 are the names of the TFTs-A1, C1, E1, F2 and the capacitor Cbst1 of the high charge driver 111a with "1" thus added being replaced with "2", respectively, and have identical connection relationship as that of the TFTs-A1, C1, E1, F2 and the capacitor Cbst1.

In the low charge driver 111b, the drain terminal of the TFT-B2 is connected to the gate line 13G of GL(n), and the net B2 is connected to the gate terminal of the TFT-G2. Regarding the TFT-G2, the drain terminal thereof is connected to the gate line 13 of GL(n), and the power source voltage VSS is supplied to the source terminal thereof. To the gate terminal of the TFT-G2, the potential of the net B2 is supplied. The state of the TFT-G2 is switched between the ON state and the OFF state depending on the potential of the net B2. The net B2 has a potential changing depending on the potential of the gate line 13G of GL(n) and the clock signals (CKA, CKB). The low charge driver 111b, depending on the potential of the net B2, charges the gate line 13G of GL(n) via the TFT-G2, to the low level.

Figure 12A:
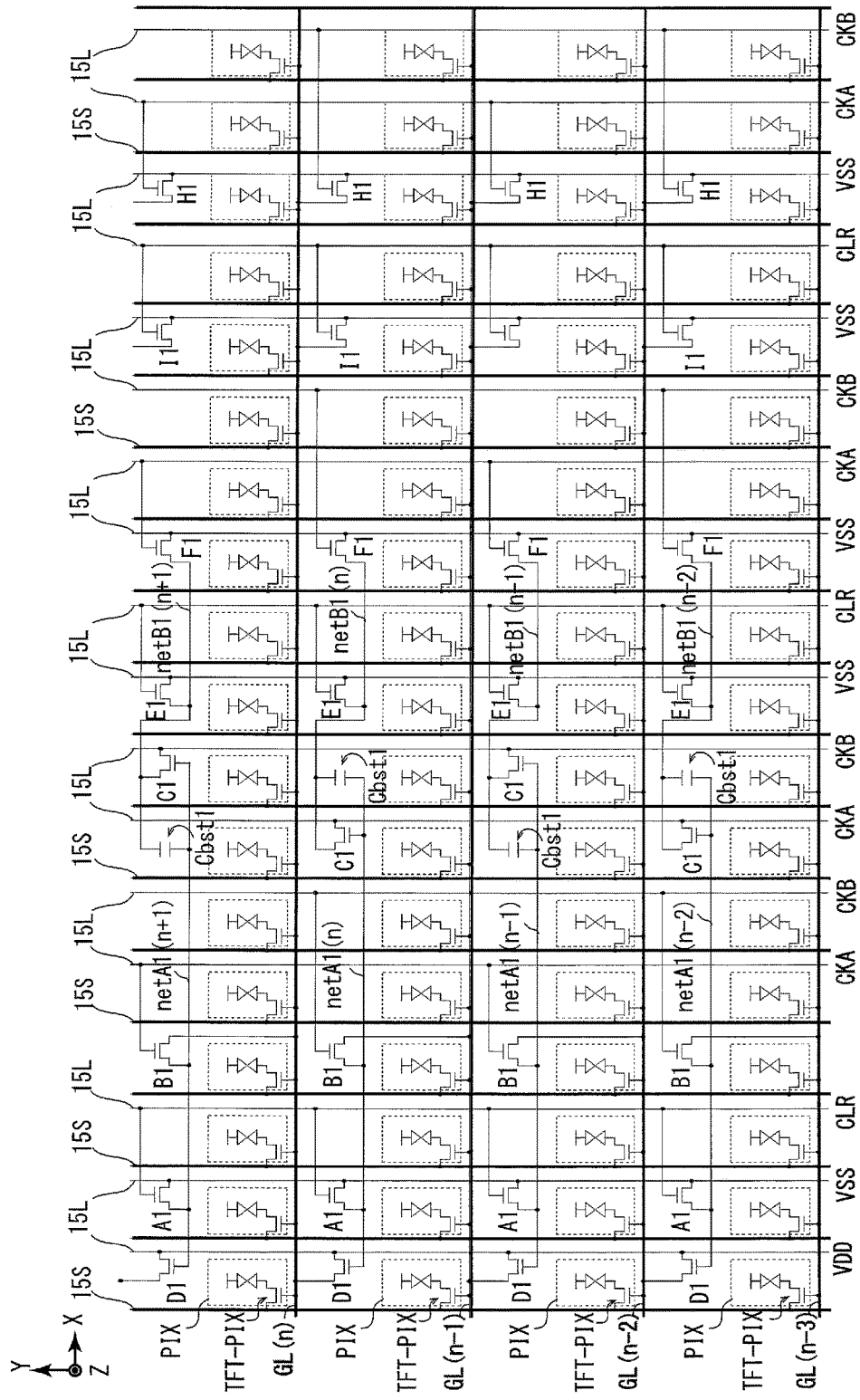
FIG. 12A illustrates an example of arrangement of a part of elements composing the gate driver shown in FIG. 11 in the display area.
Figure 12B:
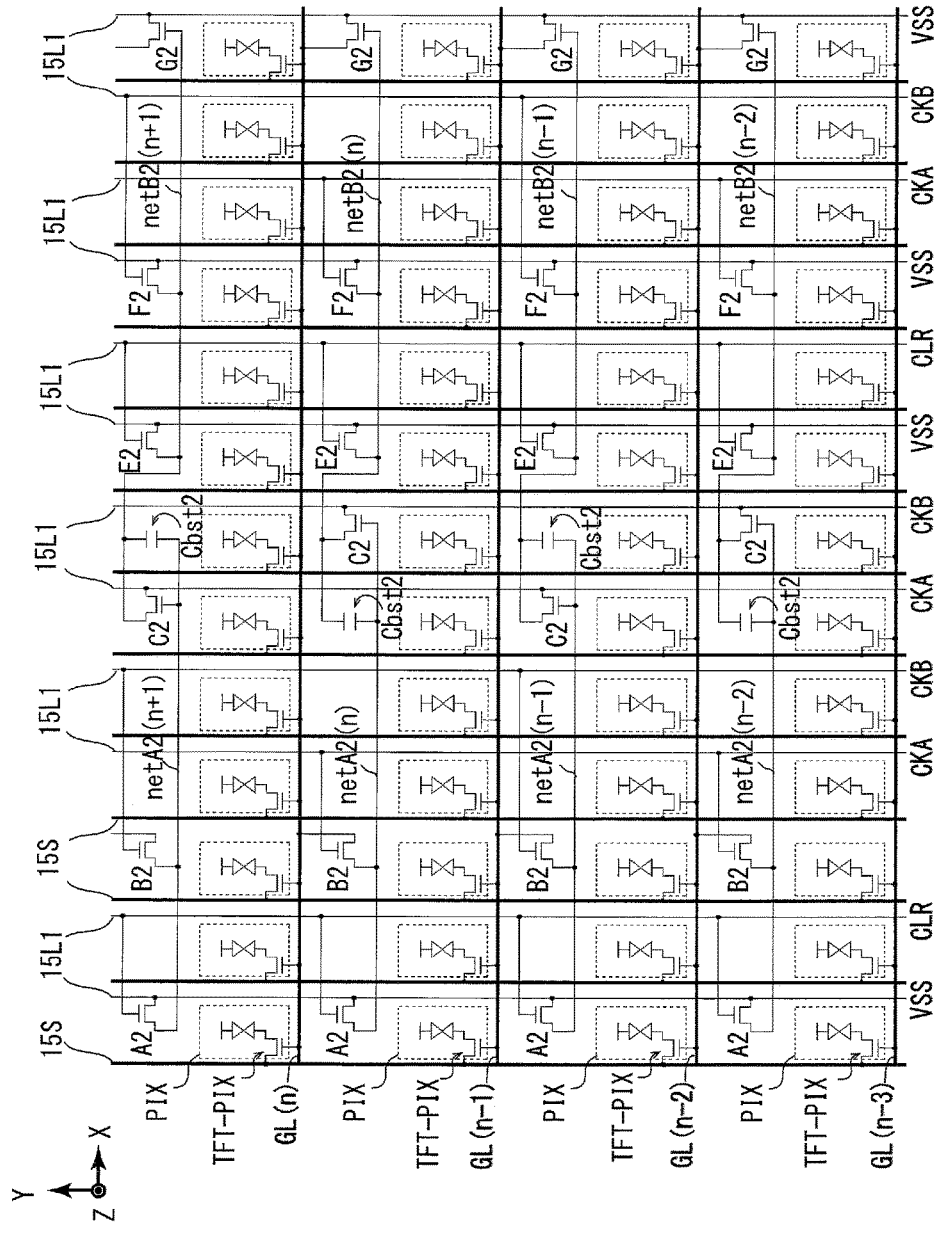
FIG. 12B is a schematic diagram illustrating an example of arrangement of a part of elements composing the gate driver shown in FIG. 11 in the display area.

Next, an example of arrangement of the gate drivers 111 in the display area in the present embodiment is described. FIGS. 12A, 12B are schematic diagram illustrating an example of arrangement of high charge drivers 111a and low charge drivers 111b illustrated in FIG. 11 in the display area. In FIGS. 12A, 12B, configurations identical to those in Embodiment 1 mentioned above are denoted by the identical reference numerals to those used in Embodiment 1. Further, for convenience sake, in FIGS. 12A, 12B, in the indications of the switching elements that compose the high charge drivers 111a and the low charge drivers 111b, the description of "TFT-" is omitted. Further, the high charge drivers 111a and the low charge drivers 111b are illustrated in FIGS. 12A and 12B separately, but FIG. 12A and FIG. 12B are continuous at the same lines. The following description is made with reference to the high charge driver 111a(n) and the low charge driver 111b(n) that scan the gate line 13G of GL(n) as an example.

The high charge driver 111a(n) is formed between the gate lines 13G of GL(n) and GL(n−1) in FIG. 12A. The low charge driver 111b is formed between the gate lines 13G of GL(n) and GL(n−1) in FIG. 12B.

As illustrated in FIG. 12A, the TFTs-A1 to F1, H1, I1 and the capacitor Cbst1 of the high charge driver 111a(n) are distributedly arranged in pixels. The source terminal of the TFT-D1 and the drain terminals of the TFTs-I1 and H1 are connected to the gate line 13G of GL(n). The drain terminal of the TFT-D1 is connected to the line 15L that supplies the power source voltage VDD. The line of the net B1 connects the source terminal of the TFT-C1, the drain terminals of the TFTs-E1 and F1, and an electrode of the capacitor Cbst1 that is not connected to the net A1, and is formed over a plurality of pixels.

As illustrated in FIG. 12B, the TFTs-A2 to C2 and E2 to G2, and the capacitor Cbst2 of the low charge driver 111b(n) are distributedly arranged in respective pixels. The drain terminals of the TFT-B2 and TFT-G2 are connected to the gate line 13G of GL(n). Further, the source terminal of the TFT-G2 is connected to the line 15L to which the power source voltage VSS is supplied. The line of the net A2 connects the drain terminal of the TFT-A2, the source terminal of the TFT-B2, the gate terminal of the TFT-C2, and an electrode of the capacitor Cbst2 that is not connected to the net B2, and is formed over a plurality of pixels. The line of the net B2 connects the drain terminals of the TFTs-E2 and F2, the source terminal of the TFT-C2, the gate terminal of the TFT-G2, an electrode of the capacitor Cbst2 that is not connected to the net A2, and is formed over a plurality of pixels.

Figure 13:
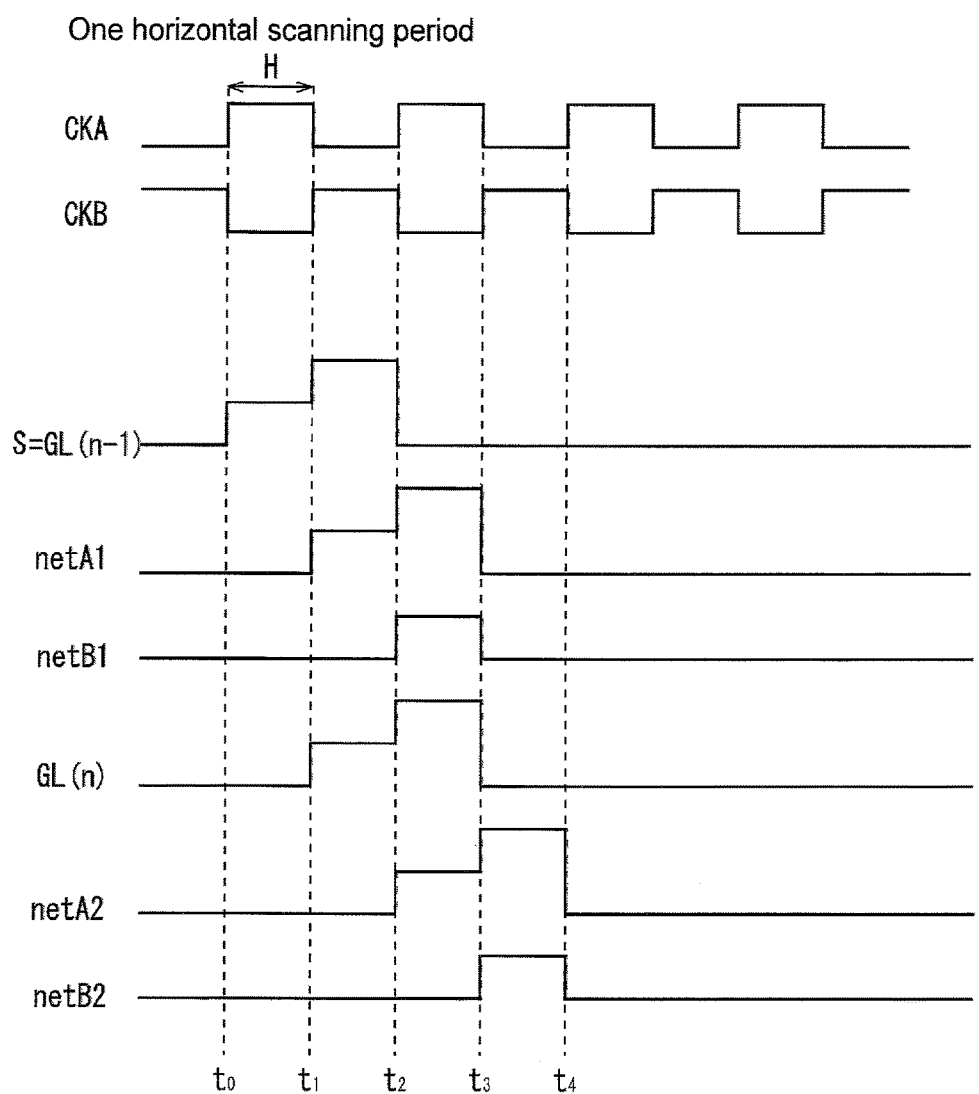
FIG. 13 is a timing chart illustrating operations of the gate driver shown in FIG. 11.

Next, operations of the high charge driver 111a and the low charge driver 111b in the present embodiment are described. FIG. 13 is a timing chart illustrating the driving timings of the high charge driver 111a and the low charge driver 111b. The start pulse signal, and the clock signals (CKA, CKB) are output from the display control circuit 4, whereby the gate drivers 11 are sequentially driven, starting from the gate driver 11 that scans the gate line 13G of GL(1). Hereinafter, exemplary operations of one gate driver 11 (high charge driver 111a and low charge driver 111b) that scans the gate lines 13G of GL(n) (2≤n≤N−1) are described.

At the time t0 in FIG. 13, the clock signal (CKA) shifts to the high level, and the clock signal (CKB) shifts to the low level. Further, the set signal S(GL(n−1)) rises to the pre-charge voltage for the gate line 13G of GL(n−1). Here, the TFT-B1 of the high charge driver 111a is in the OFF state, and the set signal S(GL(n−1)) is not input to the TFT-B1, whereby the potential of the net A1 is maintained at the low level (VSS). Further, the potential of the net A1 is input to the gate terminals of the TFT-C1 and the TFT-D1, and the TFTs-C, D are turned OFF. Since the TFTs-F1, H1, to whose gate terminals the clock signal (CKB) is input, are also in the OFF state, the potentials of the net B and the gate line 13G of GL(n) are maintained at the low level.

Next, at the time t1, the clock signal (CKB) shifts to the high level, and the clock signal (CKA) shifts to the low level. Further, here, the set signal S(GL(n−1)) rises to the potential (VDD) for the selected state of the gate line 13G of GL(n−1). The TFT-B1 is turned ON, and the set signal S(GL(n−1)) is input to the drain terminal of the TFT-B1. This causes the potential of the net A1 to be precharged up to "VDD-Vth". Vth is a threshold voltage of the TFT-B1 and the like.

The charging of the net A1 to (VDD-Vth) causes the TFT-D1 to be turned ON, and the power source voltage VDD is applied to the drain terminal of the TFT-D1. Consequently, the gate line 13G of GL(n) is precharged so that the potential thereof becomes "VDD-Vth×2". Here, the TFT-H1 is in the ON state. Since the source terminal of the TFT-H1 is grounded to the power source voltage VSS, the potential of the gate line 13G of GL(n) becomes unstable. Further, here, though both of the TFT-C1 and the TFT-F1 are in the ON state, the clock signal (CKA) at the low level (VSS) is input to the drain terminal of the TFT-C1, and the potential of the net B1 is maintained at the low level.

Further, here, the TFTs-B2 and F2 are turned OFF. Since the potential of the gate line 13G of GL(n), which is at the low level (VSS), is input to the drain terminal of the TFT-B2, the potential of the net A2 is maintained at the low level (VSS). Since the TFT-F2 is in the OFF state, the potential of the net B2 is also maintained at the low level (VSS).

Subsequently, at the time t2, the clock signal (CKB) shifts to the low level, the clock signal (CKA) shifts to the high level, and the set signal S(GL(n−1)) shifts to the low level (VSS). Then, the TFTs-B1, F1, H1 are turned OFF. The TFT-C1 is in the ON state, and the clock signal (CKA) at the high level is input to the drain terminal of the TFT-C1. This causes the potential of the net B1 to rise, the potential of the net A1 is boosted up via the capacitor Cbst1, whereby the net A1 is charged to a potential greater than VDD. Then, a potential sufficiently greater than VDD is input to the gate terminal of the TFT-D1, whereby the TFT-D1 is turned ON. Consequently, the power source voltage VDD is applied to the drain terminal of the TFT-D1, and the gate line 13G of GL(n) is charged to the high level (VDD).

Here, the TFT-B2 of the low charge driver 111b is in the ON state, the potential of the net B1 is input to the drain terminal of the TFT-B2, and the net A2 is precharged to "VDD-Vth". The TFT-C2 is turned ON, and the clock signal (CKB) at the low level (VSS) is input to the drain terminal of the TFT-C2. The TFT-F2 is turned ON due to the clock signal (CKA), and the net B2 is maintained at the low level.

Next, at the time t3, the clock signal (CKB) shifts to the high level (VDD), and the clock signal (CKA) shifts to the low level (VSS). The TFT-B1 of the high charge driver 111a is turned ON, the set signal S(GL(n−1)) is input to the drain terminal of the TFT-B, and the potential of the net A1 shifts to the low level (VSS). Further, the TFT-F1 is also turned ON, and the potential of the net B1 also shifts to the low level (VSS). Further, the potential of the net A1 falls to the low level, the TFT-D1 is turned OFF, and the TFT-H1 is turned ON.

Further, here, the TFTs-B2 and F2 of the low charge driver 111b are turned OFF, and the TFT-C2 is in the ON state due to the precharge voltage of the net A2. Since the clock signal (CKB) at the high-level (VDD) is input to the drain terminal of the TFT-C2, the potential of the net B2 rises, and the potential of the net A2 is boosted up via the capacitor Cbst2, whereby the net A2 is charged to a potential greater than VDD. Then, a potential sufficiently greater than VDD is input to the gate terminal of the TFT-C2, the voltage VDD is applied to the gate terminals of the TFT-G2, and the turning ON of the TFT-G2 causes the gate line 13G of GL(n) to be charged to the low level (VSS).

In Embodiment 3 described above, since the gate driver 11 does not have to has a line for outputting the potential of the net B1 in the high charge driver 111a to the gate driver 11 that scans the gate line 13G adjacent thereto, the parasitic capacitance of the net B1 is reduced as compare with Embodiment 1. Therefore, it is possible to prevent the increase of the electric power consumption due to the load capacitor of the clock line of the TFT-C1, without an increase in the size of the TFT-C1.

Embodiment 4

In Embodiment 3 described above, the gate line 13G is charged to the high level or the low level depending on changes of the potentials of the internal nodes (the nets A1, A2, B1, B2) of the gate driver 11. Since the timings when the potentials of the internal nodes change are determined by the connection in the circuit of the gate driver 11, it is difficult to change the selection period of the gate line 13G after the circuit of the gate driver 11 is configured.

In the present embodiment, as is the case with Embodiment 3, the gate driver 11 is composed of a high charge driver 111a and a low charge driver 111b, but the start pulse signal is independently input to the high charge driver 111a and the low charge driver 111b, so that the selection period of the gate line 13G can be arbitrarily set. Hereinafter, a part that is different from Embodiment 3 is described.

Figure 14:
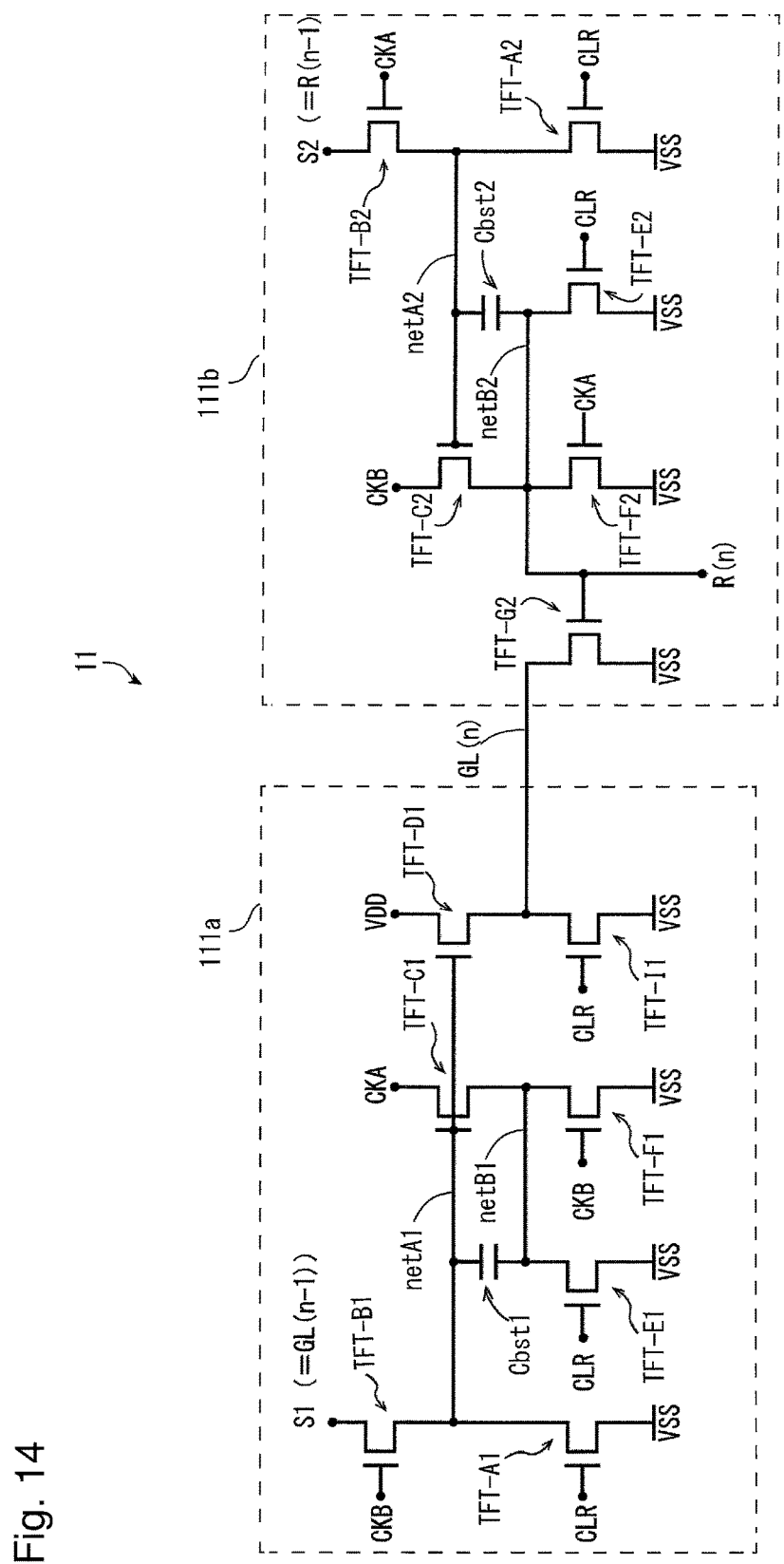
FIG. 14 illustrates an exemplary equivalent circuit of a gate driver in Embodiment 4.

FIG. 14 illustrates an equivalent circuit of the gate driver 11 in the present embodiment. As described above, the gate driver 11 in the present embodiment includes the high charge driver 111a and the low charge driver 111b. In the present embodiment, the gate driver is different from the gate driver 11 of Embodiment 3 (see FIG. 11) in the following points. As illustrated in FIG. 14, in the high charge driver 111a, a TFT-H1 is not formed with respect to the gate line 13G of GL(n). Besides, to the drain terminal of the TFT-B2 of the low charge driver 111b, the set signal S2(R(n−1)) from the low charge driver 111b of the gate driver 11 of the previous stage (GL(n−1)) is input, and the R(n) signal, exhibiting the potential of the net B2, is output to the low charge driver 111b of the next stage (GL(n+1)).

Figure 15A:
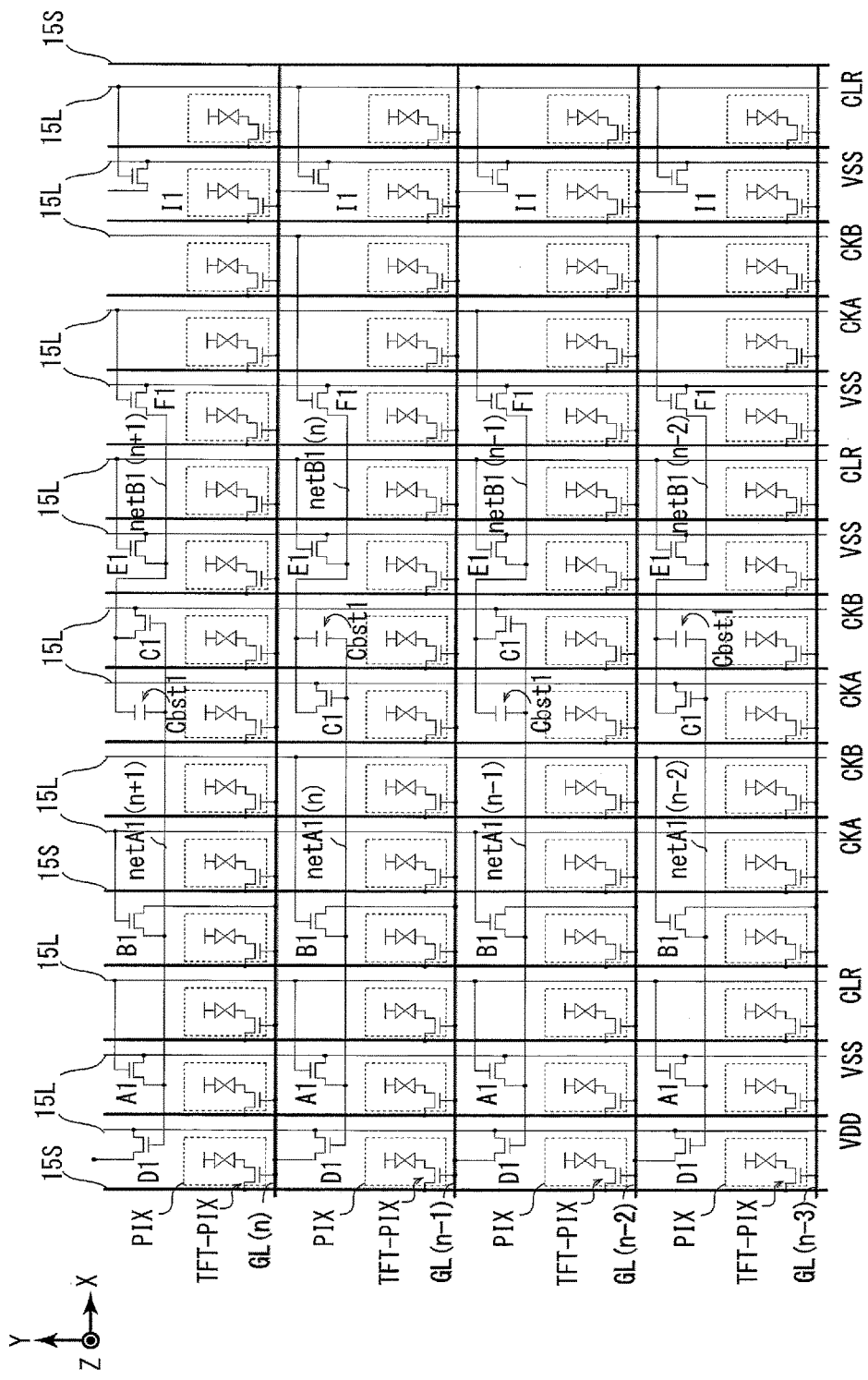
FIG. 15A illustrates an example of arrangement of the high charge drivers shown in FIG. 14 in the display area.
Figure 15B:
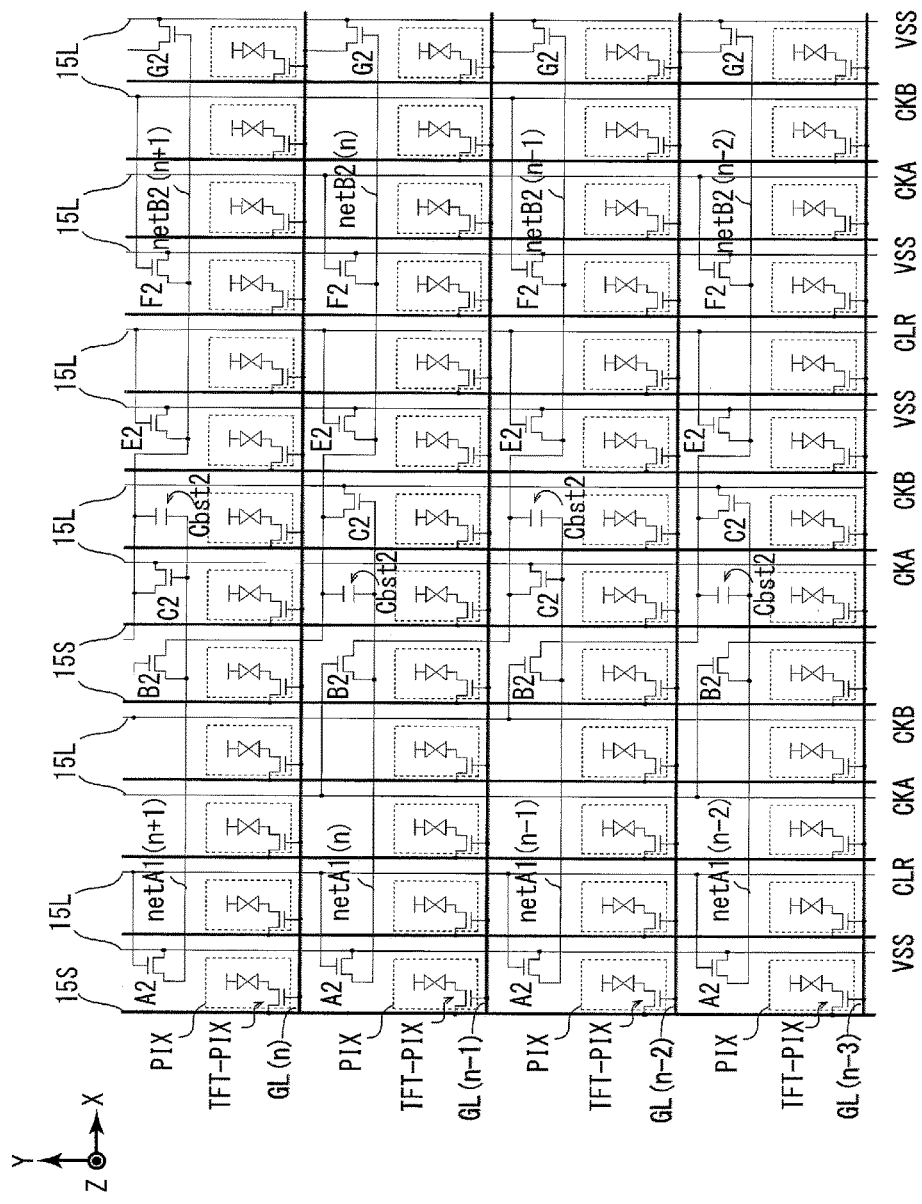
FIG. 15B illustrates an example of arrangement of the low charge drivers shown in FIG. 14 in the display area.

Here, an example of arrangement of the high charge drivers 111a and the low charge drivers 111b in the display area in the present embodiment is described. FIGS. 15A and 15B are schematic diagrams illustrating an example of arrangement of the high charge drivers 111a and the low charge drivers 111b in the display area in the present embodiment. In FIGS. 15A and 15B, configurations identical to those in Embodiment 3 mentioned above are denoted by the identical reference numerals to those used in Embodiment 3. Further, the high charge drivers 111a and the low charge drivers 111b are illustrated in FIGS. 15A and 15B separately, but FIG. 15A and FIG. 15B are continuous at the same lines. Hereinafter, the description is made with reference to the high charge driver 111a(n) and the low charge driver 111b(n) that scan the gate line 13G of GL(n) as an example.

The arrangement of the high charge drivers 111a shown in FIG. 15A is identical to the arrangement of the high charge drivers 111a shown in FIG. 12A, and the description is therefore omitted herein. As illustrated in FIG. 15B, the drain terminal of the TFT-B2 of the low charge driver 111b is connected to the net B2(n−1) of the gate driver 11 that scans the gate line 13G of previous stage (GL(n−1)). The net B2(n) in the low charge driver 111b is connected to the drain terminal of the TFT-B2(n+1) of the gate driver 11 that scans the gate line 13G of the next stage (GL(n+1)).

It should be noted that a first start pulse signal and a second start pulse signal are input, as the set signals S1, S2, from the display control circuit 4 at different timings, respectively, to drain terminals of the TFT-B2 of the low charge driver 111b and the high charge driver 111a of the gate driver 11 that scans the gate line 13 of GL(1).

Figure 16:
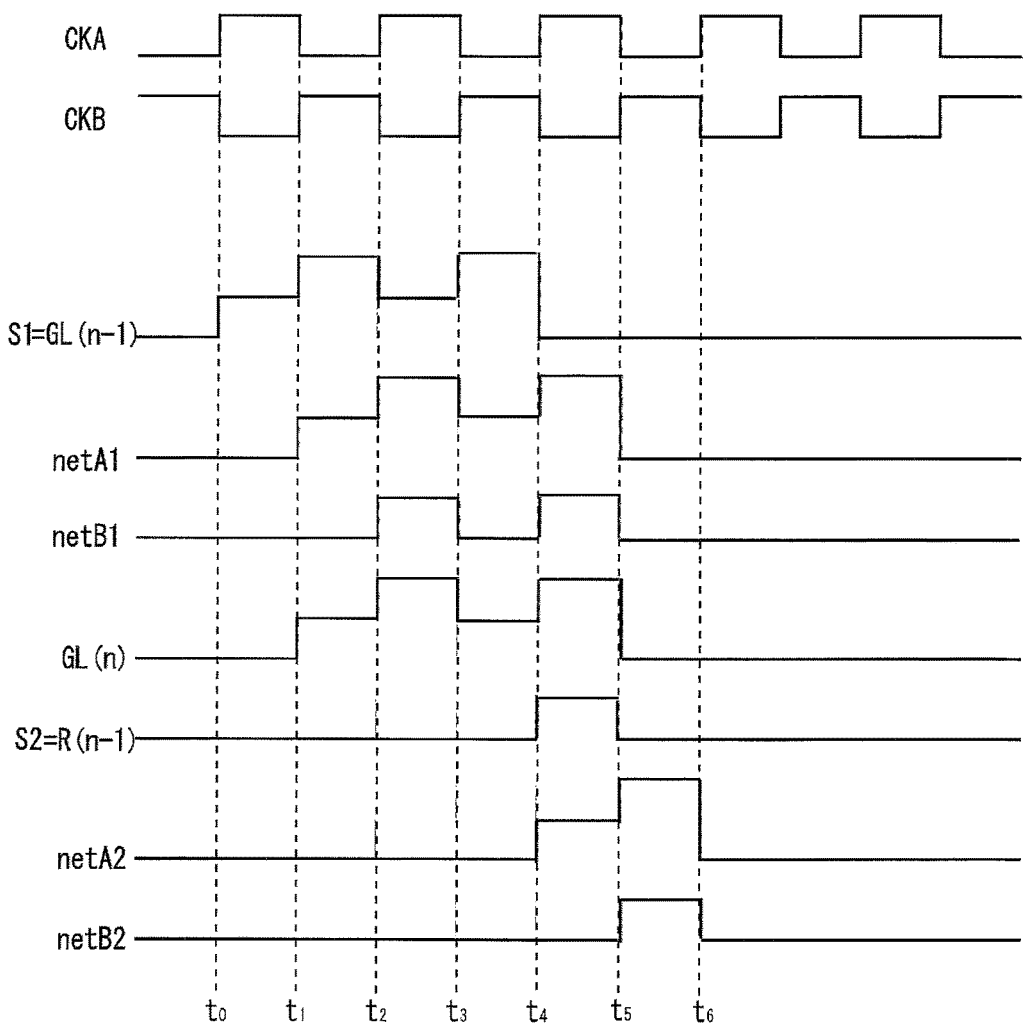
FIG. 16 is a timing chart illustrating operations of the high charge driver and the low charge driver shown in FIG. 14.

A timing chart illustrating the driving timings for the high charge driver 11a and the low charge driver 11b in the present embodiment is shown in FIG. 16. The operations from the time t0 to the time t2 in FIG. 16 are identical to those in Embodiment 3. In the example shown in FIG. 16, the second start pulse signal is input when 4 horizontal scanning periods elapse from the timing of the input of the first start pulse signal. At the timing of the time t4, therefore, the set signal S2(R(n−1)) at the high level is input to the drain terminal of the TFT-B2 of the low charge driver 11b. The low charge driver 111b, therefore, is not driven during a period from the time t2 to the time t4 while the gate line 13G is charged to the high level.

At the time t2, the clock signal (CKB) shifts to the low level, the clock signal (CKA) shifts to the high level, and the set signal S(GL(n−1)) falls to the precharge voltage ("VDD-Vth"). Here, the TFTs-B1, F1 are in the OFF state. The TFT-C1 is in the ON state due to the precharge of the net A1, and the clock signal (CKA) at the high level is input to the drain terminal of the TFT-C1. This causes the potential of the net B1 to rise, and the potential of the net A1 is boosted up via the capacitor Cbst1, whereby the net A1 is charged to a potential greater than VDD. The power source voltage VDD is applied to the drain terminal of the TFT-D1, and the gate line 13G of GL(n) is charged to the high level (VDD).

Subsequently, at the time t3, the clock signal (CKB) shifts to the high level, and the clock signal (CKA) shifts to the low level. Here, the set signal S(GL(n−1)) is maintained at the high level. The TFTs-B1, F1 are turned ON, and the set signal S1(GL(n−1)) is input via the TFT-B1. This causes the net A1 to be again charged to the precharge voltage, and the net B1 falls to the low-level potential.

Besides, the potential of the net A1 thus precharged ("VDD-Vth") is input to the gate terminal of the TFT-D1, and the power source voltage VDD is applied to the drain terminal thereof. This causes the potential of the gate line 13G of GL(n) to fall to "VDD-2Vth", like at the time t1.

Then, at the time t4, the clock signal (CKB) shifts to the low level, the clock signal (CKA) shifts to the high level, and the set signal S(GL(n−1)) falls to the low level. The TFTs-B1, F1 are turned OFF, and the TFT-C1 is in the ON state. To the drain terminal of the TFT-C1, the clock signal (CKA) at the high level is input. Like at the time t2, this causes the potential of the net B1 to rise, the potential of the net A1 is boosted up via the capacitor Cbst1, and the net A1 is charged to a potential greater than VDD. To the drain terminal of the TFT-D1, the power source voltage VDD is applied, and the gate line 13G of GL(n) is charged to the high level (VDD).

Besides, here, the TFT-B2 of the low charge driver 111b is turned ON, and the set signal S2(R(n−1)) at the high level is input to the drain terminal thereof. This causes the net A2 to be precharged, up to the precharge voltage "VDD-Vth". The TFT-C2 is turned ON due to the precharge voltage the net A2, and the clock signal (CKB) at the low level is input to the drain terminal thereof. Further, the TFT-F2 is turned ON in response to the clock signal (CKA), and the net B2 is maintained at the low level (VSS).

Subsequently, at the time t5, the clock signal (CKB) shifts to the high level, and the clock signal (CKA) shifts to the low level. As is the case with the time t3, the net A1 is charged to the precharge voltage by the high charge driver 111a, and the potential of the gate line 13G of GL(n) falls to VSS. On the other hand, in the low charge driver 111b, the TFT-C2 is in the ON state, and the input of the clock signal (CKB) at the high level to the drain terminal causes the potential of the net B2 to rise, and the potential of the net A2 is boosted up via the capacitor Cbst2. The net A2 is charged up to a potential greater than VDD, the potential of the net B2 rises to VDD via the TFT-C2, and the potential of the net B2 is input to the gate terminal of the TFT-G2. This causes the gate line 13G of GL(n) to fall to a potential of the low level (VSS).

In Embodiment 4 described above, the set signals S1, S2, which are independent from each other, are input to the high charge driver 111a and the low charge driver 111b, respectively. In a case of an active matrix substrate having low TFT properties due to variations in the process at the time of manufacture and the like, sufficient driving power cannot be achieved in some cases. In Embodiment 4 mentioned above, since the selection period of the gate line 13G can be elongated by adjusting the input timings of the set signals S1 and S2, it is possible to set optimal selection period of the gate line 13G according to properties thereof, after the active matrix substrate is produced.

Embodiment 5

As Embodiments 3 and 4 described above, examples in which both of the high charge drivers 111a and the low charge drivers 111b are formed in the display area are described, but the configuration may be such that either the high charge drivers 111a or the low charge drivers 111b are formed in the display area, and the others are formed in a frame region outside the display area.

Figure 17:
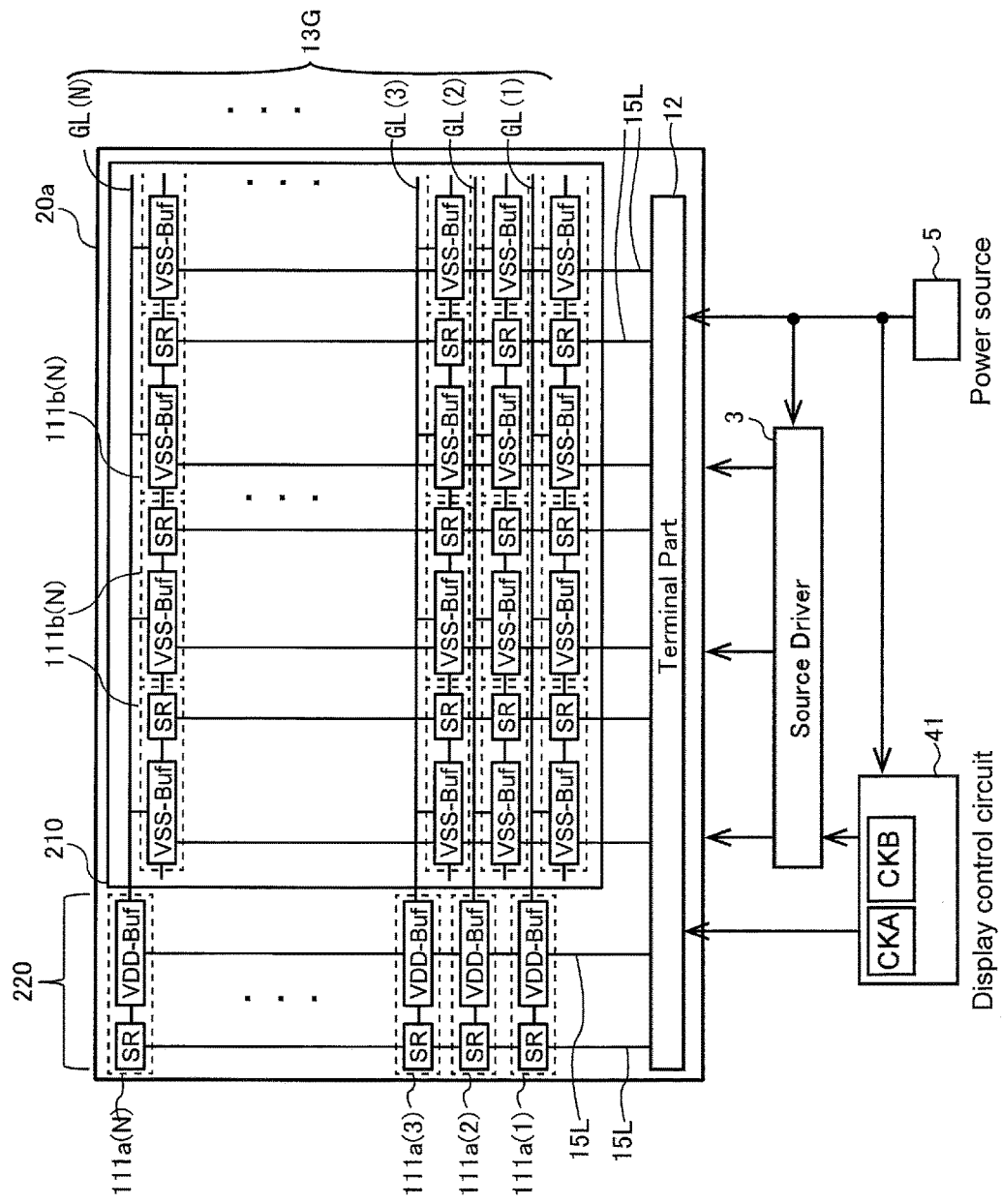
FIG. 17 is a schematic diagram that illustrates a schematic configuration of an active matrix substrate in Embodiment 5.

FIG. 17 is a top view illustrating a schematic configuration of an active matrix substrate 20a of the present embodiment, with the illustration of source lines 15S being omitted, and parts connected to the active matrix substrate 20a. In the example illustrated in FIG. 17, the high charge drivers 111a are formed in a frame region 220 on one of short sides of the active matrix substrate 20a, and the low charge drivers 111b are formed in a display area 210.

In the example illustrated in FIG. 17, one high charge driver 111a(n) (1≤n≤N) is connected to each of the gate lines 13G of GL(1) to GL(N), and a plurality of the low charge drivers 111b(n) are connected to the same. To each high charge driver 111a, the control signals including the start pulse signal, the clock signals (CKA, CKB), and the power source voltage signals (VDD, VSS) from the display control circuit 4 are input via lines 15L drawn from the terminal part 12 to the frame region. The gate line 13G of GL(n) is charged to the high level by the high charge driver 111a(n), and is charged to the low level by the plurality of low charge drivers 111b(n).

In Embodiment 5 described above, either the high charge drivers 111a or the low charge drivers 111b are formed in the display area, and the others are formed in the frame region outside the display area. As compared with the case where both of the high charge drivers 111a and the low charge drivers 111b are arranged in the frame region, therefore, the size of the frame region can be reduced. Moreover, since the high charge drivers 111a and the low charge drivers 111b charge the gate lines 13G to a high-level potential or a low-level potential with the switching elements connected to the power source voltages (VDD, VSS), the load capacitances of the clock lines can be reduced as compared with the case where the gate lines 13 are charged to the high-level potential or the low-level potential with the clock signals, whereby the electric power consumption can be reduced.

Modification Example 1

Embodiments of the present invention are described above, but the present invention is not limited to the embodiments mentioned above, and aspects of the modification example described below as well as aspects obtained by combining the modification example also fall in the scope of the present invention.

(1) As Embodiments 1 to 5 described above, examples in which the display panel 2 is a liquid crystal panel are described, but the display panel may be a panel in which an organic electro-Luminescence (EL) or the like is used. Gate drivers 11 formed on the active matrix substrate 20a of the liquid crystal panel may be applied to an active matrix substrate of an organic EL panel.

(2) In Embodiment 2 described above, the four clock signals (CKa, Ckb, CKc, CKd) are used for driving two types of the gate drivers 11x, 11 y, but, for example, four types of gate drivers 11 may be driven using eight clock signals. Here, an example in which eight clock signals are used for driving the gate lines 13G with four types of gate drivers 11 is described.

Figure 18:
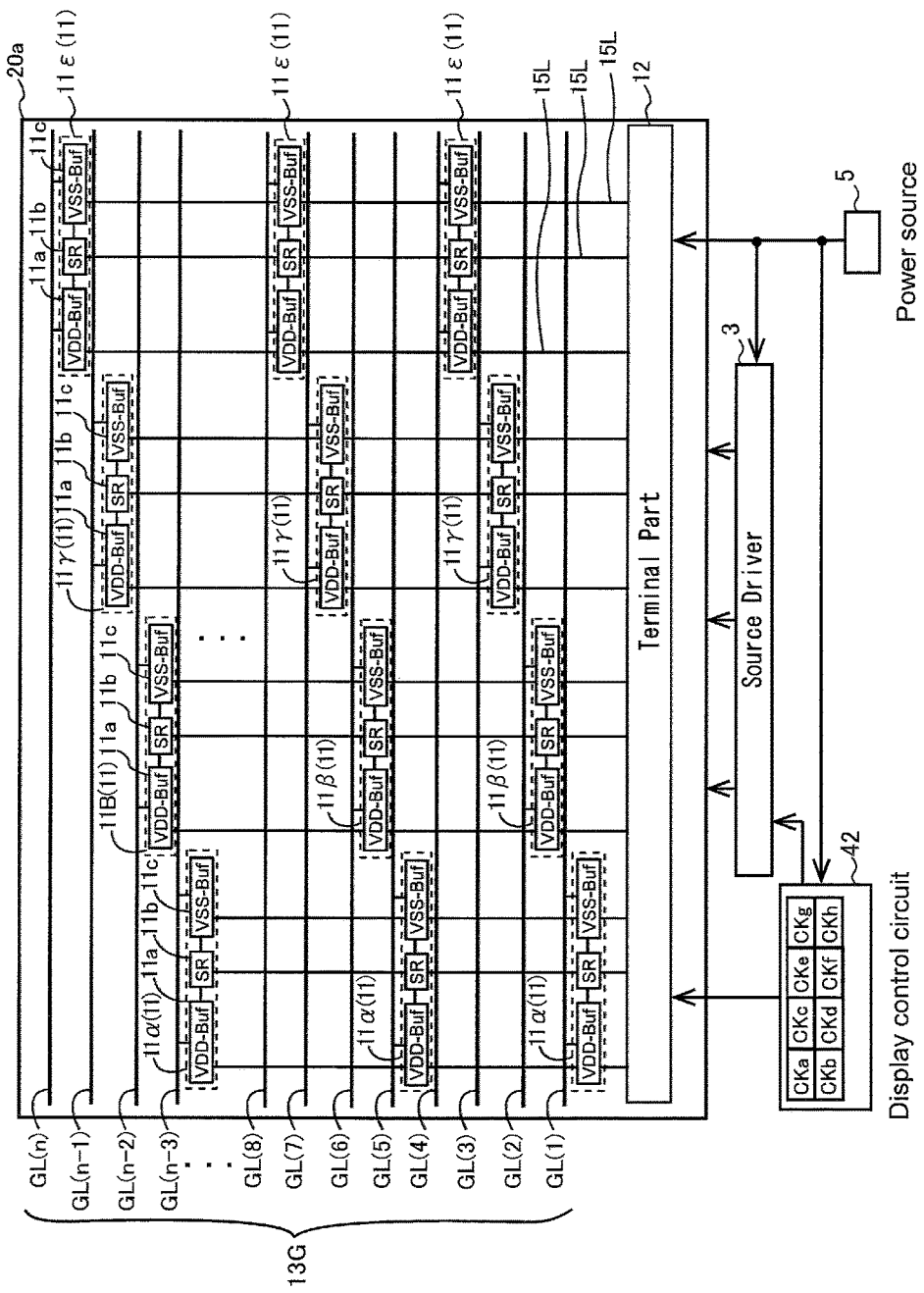
FIG. 18 is a schematic diagram that illustrates a schematic configuration of an active matrix substrate in Modification Example (2).

FIG. 18 is a top view illustrating a schematic configuration of an active matrix substrate 20a in the present modification example. In FIG. 18, like in FIG. 3 referred to above, the illustration of the source lines 15S on the active matrix substrate 20a is omitted, and a schematic configuration of respective parts connected with the active matrix substrate 20a is illustrated. As illustrated in FIG. 18, one gate driver 11 is connected to each gate line 13G on the active matrix substrate 20a.

In the present modification example, gate drivers 11α(11), gate drivers 11β(11), gate drivers 11γ(11), and gate drivers 11ε(11) are provided with respect to every four gate lines 13G that are different depending on the driver type, respectively. Each gate driver is driven individually, and switches the corresponding gate line 13G to be scanned, between the selected state and the non-selected state.

In the example shown in FIG. 18, the gate drivers 11α(11) scan the (4m−3)'th gate lines (GL(1), (4) . . . (N−3)) ("m" is an integer satisfying m≥1). The gate drivers 11β(11) scan the (4m−2)'th gate lines (GL(2), (6) . . . (N−2)) (m is an integer satisfying m≥1). Further, the gate drivers 11γ(11) scan the (4m−1)'th gate lines (GL(3), (7) . . . (N−1)). The gate drivers 11ε(11) scan the (4m)'th gate lines (GL(4), (8) . . . (N)).

Figure 19:
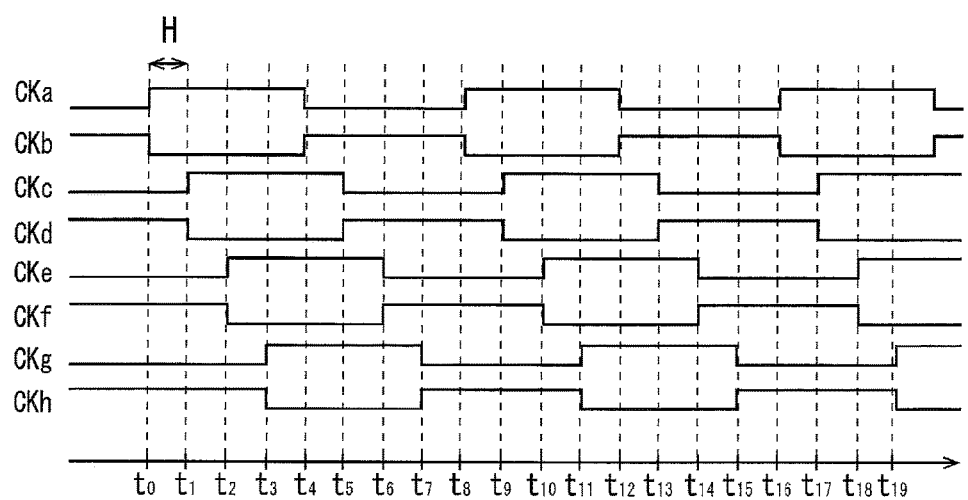
FIG. 19 illustrates an exemplary waveform of the clock signal in Modification Example (2).

The display control circuit 42 outputs clock signals (CKa, CKb), clock signals (CKc, CKd), clock signals (CKe, CKf), and clock signals (CKg, CKh) shown in FIG. 19. As shown in FIG. 19, the clock signals CKa, CKb are two-phase clock signals having phases opposite to each other that are inverted every four horizontal scanning periods. The clock signals CKc and CKd, the clock signals CKe and CKf, as well as the clock signals CKg and CKh are, similarly, two-phase clock signals having phases opposite to each other that are inverted every four horizontal scanning periods.

In other words, the clock signals (CKa, CKb), the clock signals (CKc, CKd), the clock signals (CKe, CKf), and the clock signals (CKg, CKh) have a frequency of ½ of that of the clock signals in Embodiment 2. Besides, the phases of these clock signals are shifted by ⅛ cycle each.

In the present modification example, the gate drivers 11α, 11β, 11γ, and 11ε are driven with the eight clock signals (CKa, CKb, CKc, CKd, CKe, CKf, CKg, CKh), so as to scan the gate lines 13G.

Figure 20A:
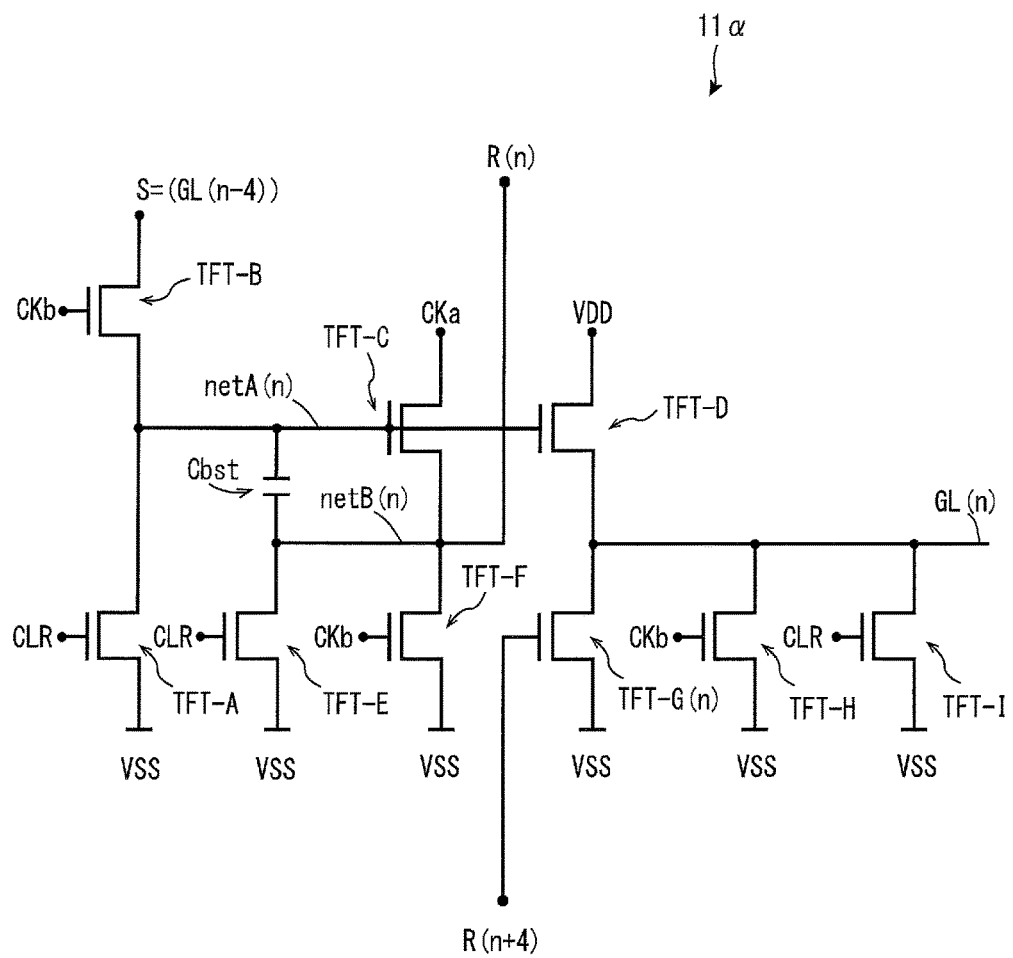
FIG. 20A illustrates an exemplary equivalent circuit of a part of the gate driver shown in FIG. 18.
Figure 20B:
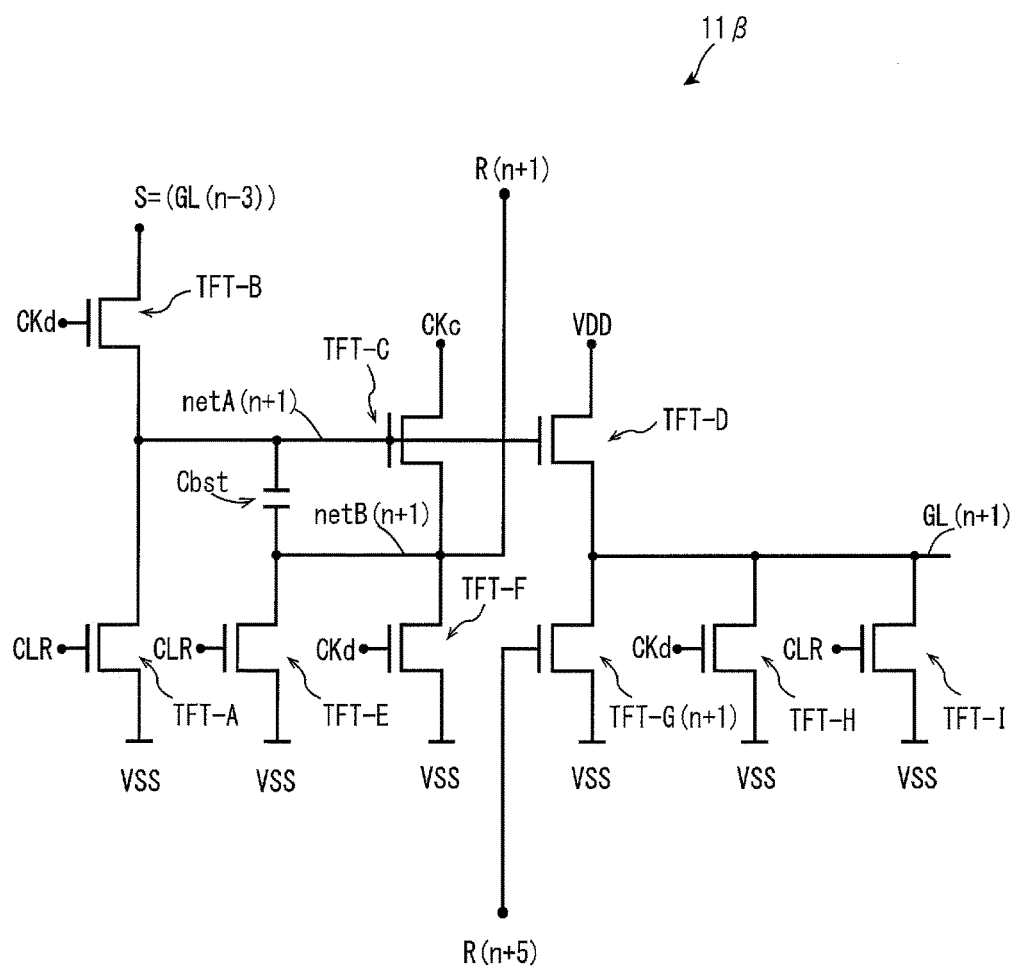
FIG. 20B illustrates an exemplary equivalent circuit of a part of the gate driver shown in FIG. 18.

Each of the gate drivers 11α, 11β, 11γ, 11ε has a configuration identical to that of the gate driver 11 in Embodiment 2 (see FIG. 4), except that the clock signal supplied to the TFTs-B, C, F, H, and the arrangement of the gate drivers 11α, 11β, 11γ, 11ε in the display area are different from those in Embodiment 2. FIG. 20A illustrates an equivalent circuit of the gate driver 11α, and FIG. 20B illustrates an equivalent circuit of gate driver 11β. Further, FIG. 20C illustrates an equivalent circuit of the gate driver 11γ, FIG. 20D illustrates an equivalent circuit of the gate driver 11ε.

As illustrated in FIG. 20A, the clock signal (CKb) is supplied to the gate terminals of the TFTs-B, F, H of the gate driver 11α(n) that scans the (4m−3)'th gate line 13G of GL(n), and the clock signal (CKa) is supplied to the drain terminal of the TFT-C thereof. Further, the potential of the gate line 13G of GL(n−4) is supplied to the drain terminal of the TFT-B. Further, a potential of an internal node net B(n) in the gate driver 11α(n) is output, as a R(n) signal, to the gate driver 11α(n−4) that drives the gate line 13G of GL(n−4). Then, a R(n+4) signal is supplied to the gate terminal of the TFT-G(n) of the gate driver 11α(n). The R(n+4) signal exhibits a potential of the net B in the gate driver 11α(n+4) that drives the gate line 13G of GL(n+4).

As illustrated in FIG. 20B, the clock signal (CKd) is supplied to the gate terminals of the TFTs-B, F, H of the gate driver 11β(n+1) that scans the (4m−2)'th gate line 13G of GL(n+1), and the clock signal (CKc) is supplied to the drain terminal of the TFT-C. Further, the potential of the gate line 13G of GL(n−3) is supplied to the drain terminal of the TFT-B. The potential of the net B(n+1) of the gate driver 11β(n+1) is output, as a R(n+1) signal, to the gate driver 11β(n−3) that drives the gate line 13G of GL(n−3). Then, a R(n+5) signal is supplied to the gate terminal of the TFT-G(n+1) of the gate driver 11α(n+1). The R(n+5) signal exhibits a potential of the net B in the gate driver 11α(n+5) that drives the gate line 13G of GL(n+5).

Figure 20C:
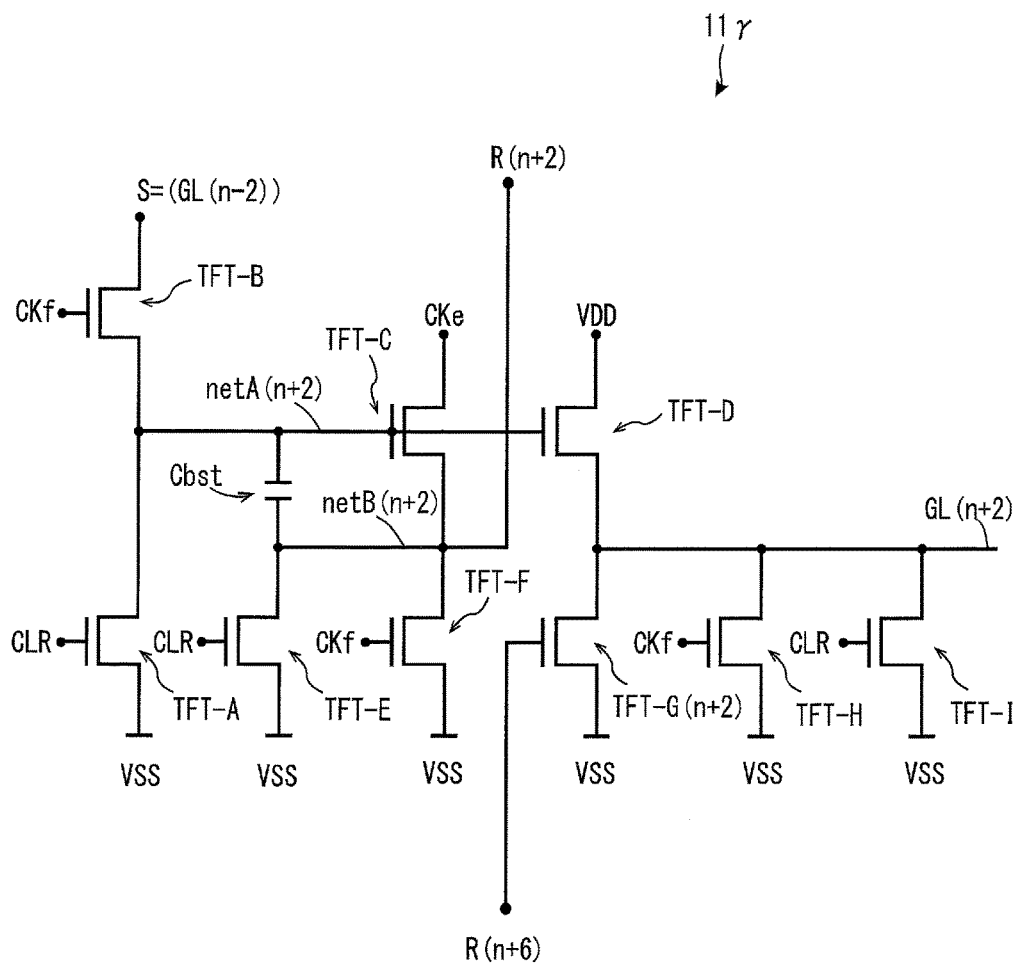
FIG. 20C illustrates an exemplary equivalent circuit of a part of the gate driver shown in FIG. 18.
Figure 20D:
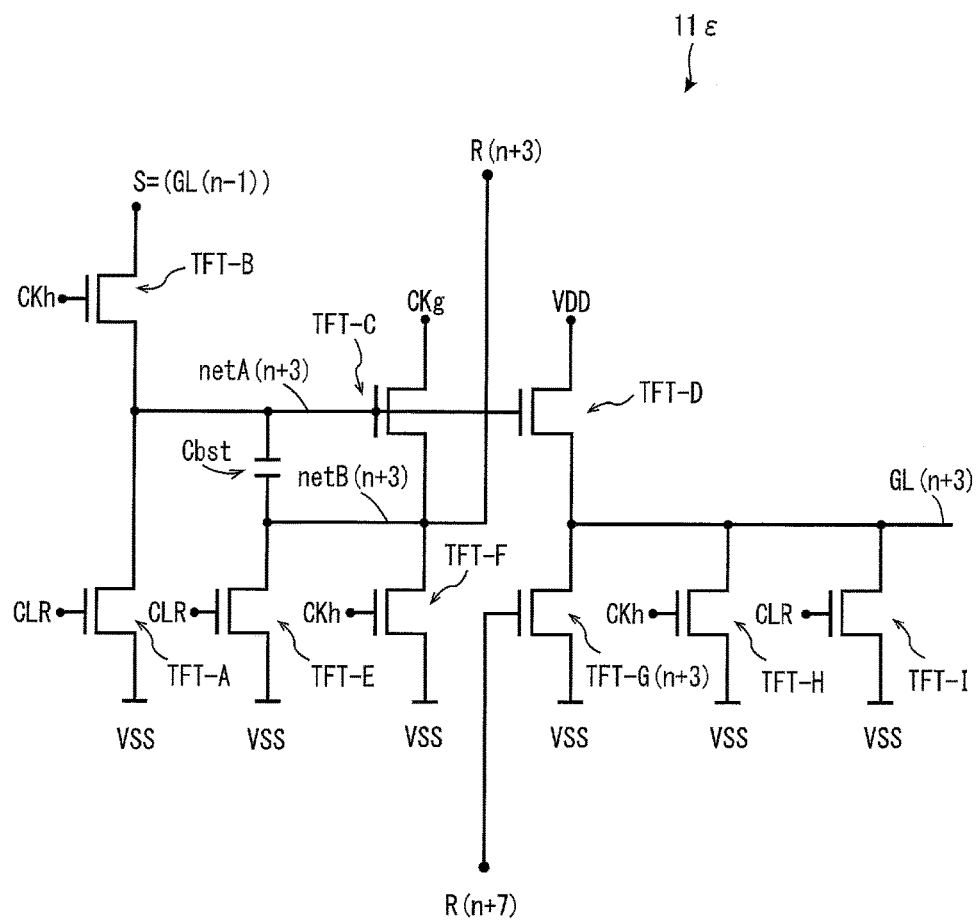
FIG. 20D illustrates an exemplary equivalent circuit of a part of the gate driver shown in FIG. 18.

As illustrated in FIG. 20C, the clock signal (CKf) is supplied to the gate terminals of the TFTs-B, F, H of the gate driver 11γ(n+2) that scans the (4m−1)'th gate line 13G of GL(n+2), and the clock signal (CKe) is supplied to the drain terminal of the TFT-C. Further, the potential of the gate line 13G of GL(n−2) is supplied to the drain terminal of the TFT-B. Further, the potential of the net B(n+2) of the gate driver 11γ(n+2) is output, as a R(n+2) signal, to the gate driver 11γ(n−2) that drives the gate line 13G of GL(n−2). Then, a R(n+6) signal is supplied to the gate terminal of the TFT-G(n+2) of the gate driver 11γ(n+2). The R(n+6) signal exhibits a potential of the net B in the gate driver 11γ(n+6) that drives the gate line 13G of GL(n+6).

As illustrated in FIG. 20D, the clock signal (CKh) is supplied to the gate terminals of the TFTs-B, F, H of the gate driver 11ε(n+3) that scans the (4m)'th gate line 13G of GL(n+3), and the clock signal (CKg) is supplied to the drain terminal of the TFT-C thereof. Further, the potential of the gate line 13G of GL(n−1) is supplied to the drain terminal of the TFT-B thereof. Further, a potential of the net B(n+3) of the gate driver 11ε(n+3) is output, as a R(n+3) signal, to the gate driver 11ε(n−1) that drives the gate line 13G of GL(n−1). Then, a R(n+7) signal is supplied to the gate terminal of the TFT-G(n+3) of the gate driver 11ε(n+3). The R(n+7) signal exhibits a potential of the net B in the gate driver 11ε(n+7) that drives the gate line 13G of GL(n+7).

Figure 21:
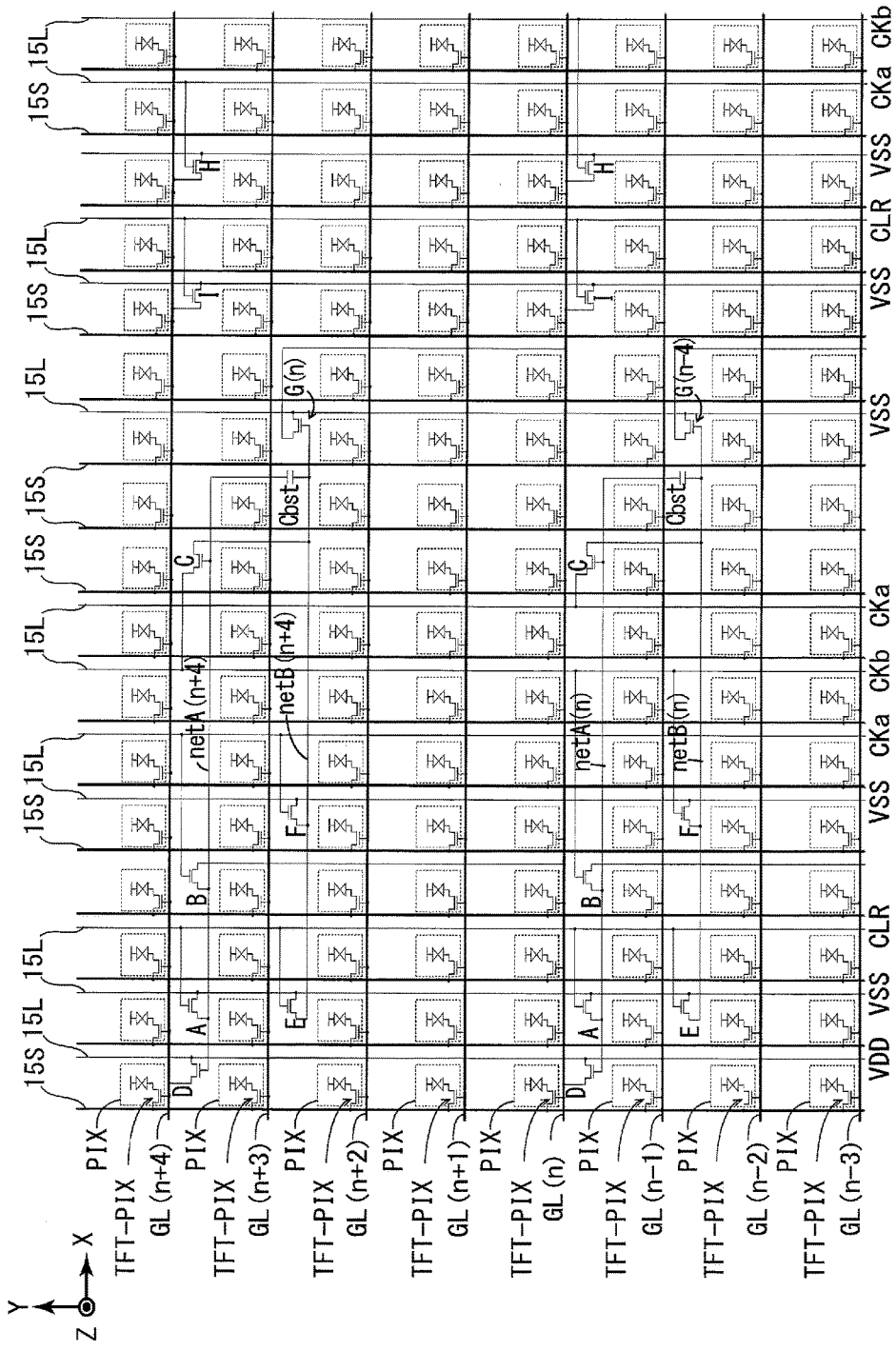
FIG. 21 is a schematic diagram showing an example of arrangement of the gate drivers shown in FIG. 20A in the display area.

Next, an example of arrangement of the gate drivers 11 in the display area in the present modification example is described. FIG. 21 illustrates an example of the arrangement of the gate drivers 11α in the display area. In FIG. 21, configurations identical to those in Embodiment 1 mentioned above are denoted by the identical reference numerals to those used in Embodiment 1. Besides, as is the case with FIG. 5 referred to above, thick lines parallel to the Y axis in FIG. 21 indicate the source line 15S, and the thick lines parallel to the X axis indicate the gate lines 13G. Further, for convenience sake, in FIG. 21, in the indications of the switching elements that compose the gate drivers 11α, the description of "TFT-" is omitted.

In FIG. 21, each element of the gate driver 11α(n) that drives the gate line 13G of GL(n), except for the TFT-G(n), is formed over two stages, that is, between GL(n) and GL(n−1), as well as between GL(n−1) and GL(n−2). Further, each element of the gate driver 11α(n+4) that drives the gate line 13G of GL(n+4), except for the TFT-G(n+4), is formed over two stages, that is, between GL(n+4) and GL(n+3), and between GL(n+3) and GL(n+2).

The lines of the net A(n) of the gate driver 11α(n) and the net A(n+4) of the gate driver 11α(n+4) are drawn to one of electrodes of each of the capacitors Cbst of the gate driver 11α(n) and the gate driver 11α(n+4), as is the case with Embodiment 2. The lines of the net B(n) and the net B(n+4) are formed in stages lower than the stages where the net A(n) and the net A(n+4) are formed, respectively.

The TFT-G(n) of the gate driver 11α(n) is formed in the same stage as that of the net B(n+4), and the gate terminal of the TFT-G(n) is connected to the net B(n+4). Besides, in the stage of the net B(n), the TFT-G(n−4) of the gate driver 11α(n−4) that scans the gate line 13G of GL(n−4) (not shown) is formed, and the gate terminal of the TFT-G(n−4) is connected to the net B(n).

The drain terminal of the TFT-B of the gate driver 11α(n) is connected to the gate line 13G of GL(n−4) (not shown), and the drain terminal of the TFT-B of the gate driver 11α(n+4) is connected to the gate line 13G of GL(n).

The example of arrangement of the gate drivers 11β, 11γ, and 11ε in the display area is identical to that of the gate drivers 11α only except that the gate line 13G to which these gate drivers are connected is different from that to which the gate driver 11α is connected. The description of the example of arrangement of these gate drivers is, therefore, omitted herein.

Figure 22A:
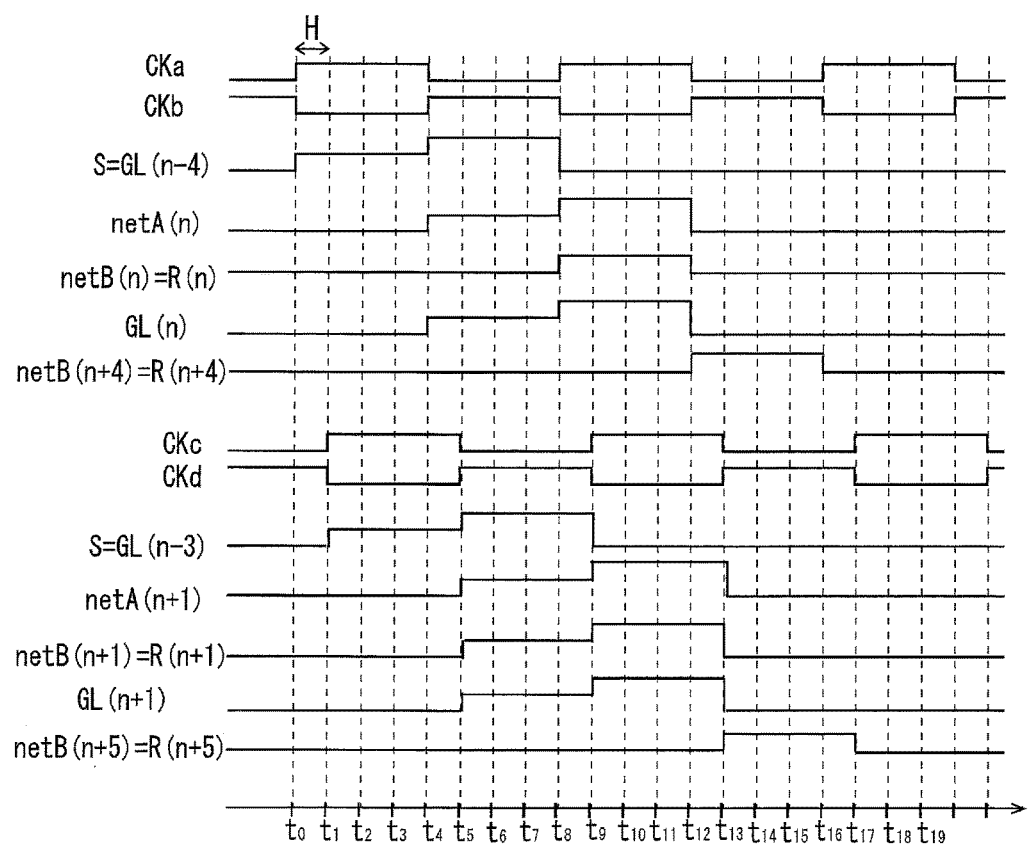
FIG. 22A is a timing chart illustrating operations of the gate drivers shown in FIGS. 20A and 20B.
Figure 22B:
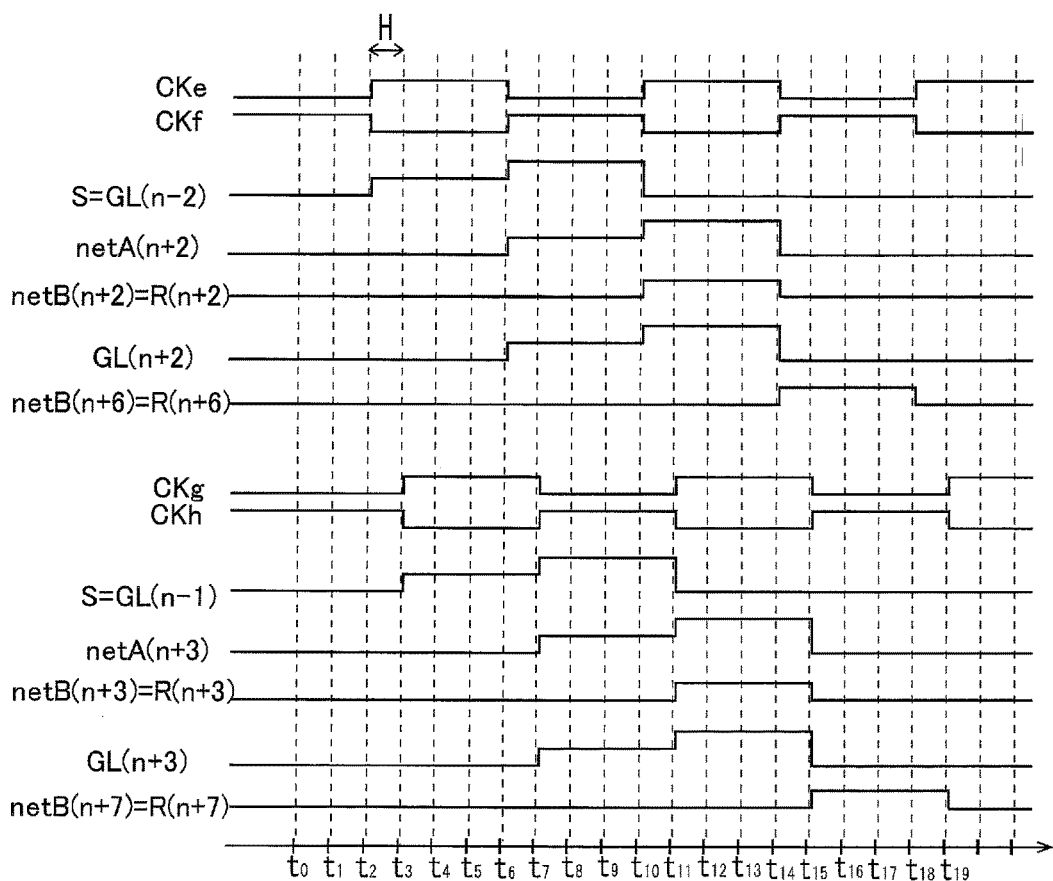
FIG. 22B is a timing chart illustrating operations of the gate drivers shown in FIGS. 20C and 20D.

Next, operations of the gate drivers 11 in the present modification example are described with reference to FIGS. 22A and 22B. FIGS. 22A and 22B are timing charts that show driving timings for driving the gate drivers 11α, 11β, 11γ, and 11ε that scan the gate lines 13G of GL(n) to GL(n+3), respectively.

Though the illustration is omitted in FIGS. 22A and 22B, a reset signal (CLR) that becomes a high level for a certain set period every vertical scanning period is input from the display control circuit 42 to the gate drivers 11α, 11β, 11γ, and 11ε. In response to the input of the reset signal (CLR), the potentials of the nets A(n) to A(n+3), the nets B(n) to B(n+3), and the gate lines 13G of GL(n) to GL(n+3) make transition to the low level (VSS). The high level of the clock signals CKa, CKb, CKc, CKd, CKe, CKf, CKg, CKh corresponds to the power source voltage VDD, and the low level thereof corresponds to the power source voltage VSS.

The start pulse signal is output from the display control circuit 42, and the clock signals (CKa, CKb, CKc, CKd, CKe, CKf, CKg, CKh) are output, whereby the gate drivers 11 are sequentially driven, starting from the gate driver 11 that scans the gate line 13G of GL(1).

As illustrated in FIGS. 22A and 22B, the frequency of the clock signal of the present modification example is ½ of that of the clock signal in Embodiment 2, and the phases of the clock signals are shifted by ⅛ cycle from one another. The nets A(n) to A(n+3), and the nets B(n) to B(n+3), therefore, sequentially shift to the high-level potential with a delay of four horizontal scanning periods as compared with the case of Embodiment 2, and the charging period while the gate line 13G is charged with the high-level potential has a length twice that in Embodiment 2. In the present modification example, therefore, it is possible to reduce the frequency of the clock signal, and to ensure twice the charging time for the gate line 13G, as compared with Embodiment 2. Consequently, the operating margins for the gate drivers 11α, 11β, 11γ, and 11ε can be further improved, as compared with the case of Embodiment 2.

In Embodiment 2, either the first clock signals (CKa, CKb) or the second clock signals (CKc, CKd) are supplied to the gate driver 11 (drive circuit) as two sets of clock signals whose amplitudes change every two horizontal scanning periods. The phase difference between the two sets of clock signals is one horizontal period. In Embodiment 2, the first clock signals are supplied to the gate drivers 11 corresponding to the odd-numbered gate lines 13G, and the second clock signals are supplied to the gate drivers 11 corresponding to the even-numbered gate lines 13G. In other words, the two sets of clock signals are supplied to the gate drivers in such a manner that the each set of clock signals is supplied to every two lines that are different depending on the signal set.

In Modification Example (2), either first clock signals (CKa, CKb), second clock signals (CKc, CKd), third clock signals (CKe, CKf), or fourth clock signals (CKg, CKh), which are four sets of clock signals whose amplitudes change every four horizontal scanning periods, are supplied to the gate driver 11 (drive circuit). In Modification Example (2), the first clock signals are supplied to the gate driver 11 with respect to the (4m−3)'th gate line ("m" is an integer satisfying m≥1), the second clock signals are supplied to the gate driver 11 with respect to the (4m−2)'th gate line. Further, the third clock signals are supplied to the gate driver 11 with respect to the (4m−1)'th gate line, and the fourth clock signals are supplied to the gate driver 11 with respect to the (4m)'th gate line. In other words, the four sets of clock signals are supplied to the gate drivers in such a manner that the each set of clock signals is supplied to every four gate lines 13G that are different depending on the signal set.

Then, in both cases of Embodiment 2 and Modification Example (2), each gate line 13G is charged to a potential of the high level for a period longer than one horizontal scanning period by the high-charge drive circuit (first charging drive circuit) of the gate driver 11 that drives the gate line 13G concerned. The charging periods for charging adjacent ones of the gate lines 13G to the potential at the high level overlap for at least one horizontal period.

INDUSTRIAL APPLICABILITY

The present invention is industrially applicable as a display device including gate drivers.

The invention claimed is:
1. An active matrix substrate comprising a plurality of gate lines, and a plurality of data lines that intersect the plurality of gate lines, the active matrix substrate including a display area, the active matrix substrate further comprising:
- a plurality of drive circuits provided for the plurality of gate lines, respectively, each of the plurality of drive circuits switching a state of a respective gate line according to a control signal supplied thereto, to either one of a selected state for selection of the respective gate line and a non-selection state for non-selection of the respective gate line, wherein
- each of the plurality of drive circuits includes a first charging driving portion and a second charging driving portion,
- the first charging driving portion includes a switching element that is supplied with a first DC voltage signal corresponding to the selected state, the switching element of the first charging driving portion charging the gate line to a potential of the first DC voltage signal,
- the second charging driving portion includes a switching element that is supplied with a second DC voltage signal corresponding to the non-selected state and having a voltage lower than that of the first DC voltage signal, the switching element of the second charging driving portion charging the respective gate line to a potential of the second DC voltage signal, and
- at least one of the first charging driving portion and the second charging driving portion is in the display area,
- the gate lines are N in number (N is an integer),
- a first start pulse signal is input to the first charging driving portion in the first drive circuit provided with respect to the first gate line, among the drive circuits, and the first charging driving portion charges the first gate line to the potential of the first DC voltage signal according to the first start pulse signal,
- a second start pulse signal different from the first start pulse signal is input to the second charging driving portion in the first drive circuit, and the second charging driving portion charges the first gate line to the potential of the second DC voltage signal according to the second start pulse signal,
- the first charging driving portion in the n'th drive circuit provided with respect to the n'th gate line ($2 \leq n \leq N$), among the drive circuits, is connected to the n−1'th gate line, and the first charging driving portion charges the n'th gate line to the potential of the first DC voltage signal according to the potential of the n−1'th gate line, and
- the second charging driving portion in the n'th drive circuit is connected to the second charging driving portion in the drive circuit provided with respect to the n−1'th gate line, and charges the n'th gate line to the potential of the second DC voltage signal according to the output potential of the second charging driving portion in the n−1'th drive circuit.

2. A display panel comprising:
the active matrix substrate according to claim 1;
a pixel electrode on the active matrix substrate;
a counter substrate including a common electrode and a color filter; and
a liquid crystal layer between the active matrix substrate and the counter substrate.

3. A display device comprising:
the display panel according to claim 2;
a display control circuit that outputs a control signal including a clock signal to the display panel; and
a power source circuit that supplies a DC voltage signal to the display panel.

* * * * *